(12) United States Patent
Hsiao et al.

(10) Patent No.: US 11,575,030 B2
(45) Date of Patent: *Feb. 7, 2023

(54) HETEROJUNCTION BIPOLAR TRANSISTOR AND METHOD FOR FORMING THE SAME

(71) Applicant: WIN SEMICONDUCTORS CORP., Taoyuan (TW)

(72) Inventors: She-Hsin Hsiao, Taoyuan (TW); Rong-Hao Syu, Taoyuan (TW); Shu-Hsiao Tsai, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/501,415

(22) Filed: Oct. 14, 2021

(65) Prior Publication Data

US 2022/0052188 A1 Feb. 17, 2022

Related U.S. Application Data

(63) Continuation of application No. 16/990,028, filed on Aug. 11, 2020, now Pat. No. 11,177,374.

(51) Int. Cl.
*H01L 29/737* (2006.01)
*H01L 29/08* (2006.01)
*H01L 23/522* (2006.01)

(52) U.S. Cl.
CPC ........ *H01L 29/737* (2013.01); *H01L 23/5226* (2013.01); *H01L 29/0817* (2013.01)

(58) Field of Classification Search
CPC .............. H01L 29/737; H01L 23/5226; H01L 29/0817; H01L 29/66318; H01L 29/0657; H01L 29/0813; H01L 29/42304; H01L 29/7371

See application file for complete search history.

(56) References Cited

U.S. PATENT DOCUMENTS

| 5,242,843 | A | 9/1993 | Aina |
| 5,712,504 | A | 1/1998 | Yano et al. |
| 6,885,042 | B2 | 4/2005 | Yanagisawa et al. |
| 6,903,387 | B2 | 6/2005 | Hase |
| 7,030,429 | B2 | 4/2006 | Kawasaki et al. |
| 2002/0117665 | A1 | 8/2002 | Yaegassi et al. |
| 2020/0168725 | A1 | 5/2020 | Kurokawa et al. |

*Primary Examiner* — Syed I Gheyas
(74) *Attorney, Agent, or Firm* — McClure, Qualey & Rodack, LLP

(57) ABSTRACT

A heterojunction bipolar transistor includes an emitter layer on a base layer on a collector layer on an upper sub-collector layer over a bottom sub-collector layer, a first dielectric film over the bottom sub-collector layer, the base layer and the emitter layer, a base electrode on the first dielectric film, electrically connected to the base layer through at least one first via hole in the first dielectric film, a second dielectric film on the first dielectric film and the base electrode, and a conductive layer on the second dielectric film, with conductive layer electrically connected to base electrode through a second via hole disposed in the second dielectric film, first dielectric film between the base electrode and first sidewall of a stack including the base layer and the collector layer, and second via hole laterally separated from the base layer.

20 Claims, 19 Drawing Sheets

HETEROJUNCTION BIPOLAR TRANSISTOR AND METHOD FOR FORMING THE SAME

CROSS REFERENCE TO RELATED APPLICATIONS

This application is a Continuation of pending U.S. patent application Ser. No. 16/990,028, filed on Aug. 11, 2020 and entitled "HETROJUNCTION BIPOLAR TRANSISTOR AND METHOD FOR FORMING THE SAME", issued on Nov. 16, 2021 as U.S. Pat. No. 11,177,374, the entirety of which is incorporated by reference herein.

BACKGROUND

Technical Field

The disclosure relates to a semiconductor structure, and more particularly to a heterojunction bipolar transistor and a method for forming the heterojunction bipolar transistor.

Description of the Related Art

A heterojunction bipolar transistor (HBT) is a bipolar junction transistor with two different materials with different energy band-gaps. Heterojunction bipolar transistors are widely used in the industry due to their many advantages, which include a low base resistance, a high cut-off frequency, a high efficiency, more design flexibility, and a low cost.

An base-collector parasitic capacitance determined by the base-collector contact area of HBT may impact the maximum operation frequency and the device performance. In order to improve the device performance, such as the maximum stable gain (MSG) of HBT, the base-collector contact area of an HBT needs to be reduced further.

Although existing heterojunction bipolar transistors have generally been adequate for their intended purposes, they have not been entirely satisfactory in all respects, and need to be improved. This is especially true of the reduction of the collector resistance.

BRIEF SUMMARY

The present disclosure provides a heterojunction bipolar transistor including a first sub-collector layer, a collector layer, a base layer, an emitter layer, a first dielectric film, a base electrode, a second dielectric film and a conductive layer. The collector layer is disposed over the first sub-collector layer. The base layer is disposed on the collector layer. The emitter layer is disposed on the base layer. The first dielectric film is disposed over the first sub-collector layer and extends over the base layer and the emitter layer. The base electrode is disposed on the first dielectric film and is electrically connected to the base layer through at least one first via hole disposed in the first dielectric film. The base electrode comprises a lower portion disposed in the first via hole and an upper portion disposed on the first dielectric film and covering the lower portion. The first dielectric film is disposed between the base electrode and a first sidewall of a stack including the base layer and the collector layer. The upper portion is wider or longer than the lower portion. The second dielectric film is disposed on the first dielectric film and the base electrode. The conductive layer is disposed on the second dielectric film and electrically connected to the emitter layer through a third via hole through the second dielectric film and the first dielectric film. The height of the third via hole is greater than the height of the first via hole.

The present disclosure also provides a heterojunction bipolar transistor including a first mesa, a second mesa, a first sub-collector layer, a first dielectric film, a base electrode, a second dielectric film and a conductive layer. The first mesa is disposed on the second mesa. The second mesa is disposed over the first sub-collector layer. The second mesa comprises at least a part of a collector layer and a base layer disposed on the part of the collector layer. The first mesa comprises an emitter layer disposed on the base layer. The first dielectric film is disposed over the first sub-collector layer. The first dielectric film covers the second mesa and the first mesa. The base electrode is disposed on the first dielectric film and is electrically connected to the base layer through at least one first via hole disposed in the first dielectric film. The first dielectric film is sandwiched between the base electrode and a first sidewall of the second mesa. Parts of the base electrode disposed on the first dielectric film and parts of the base electrode disposed in the first via hole have a T-shaped profile in a first cross-sectional view. The second dielectric film is disposed on the first dielectric film and the base electrode. The conductive layer is disposed on the second dielectric film and is electrically connected to the first mesa through a third via hole through the second dielectric film and the first dielectric film. The height of the third via hole is greater than the height of the first via hole.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
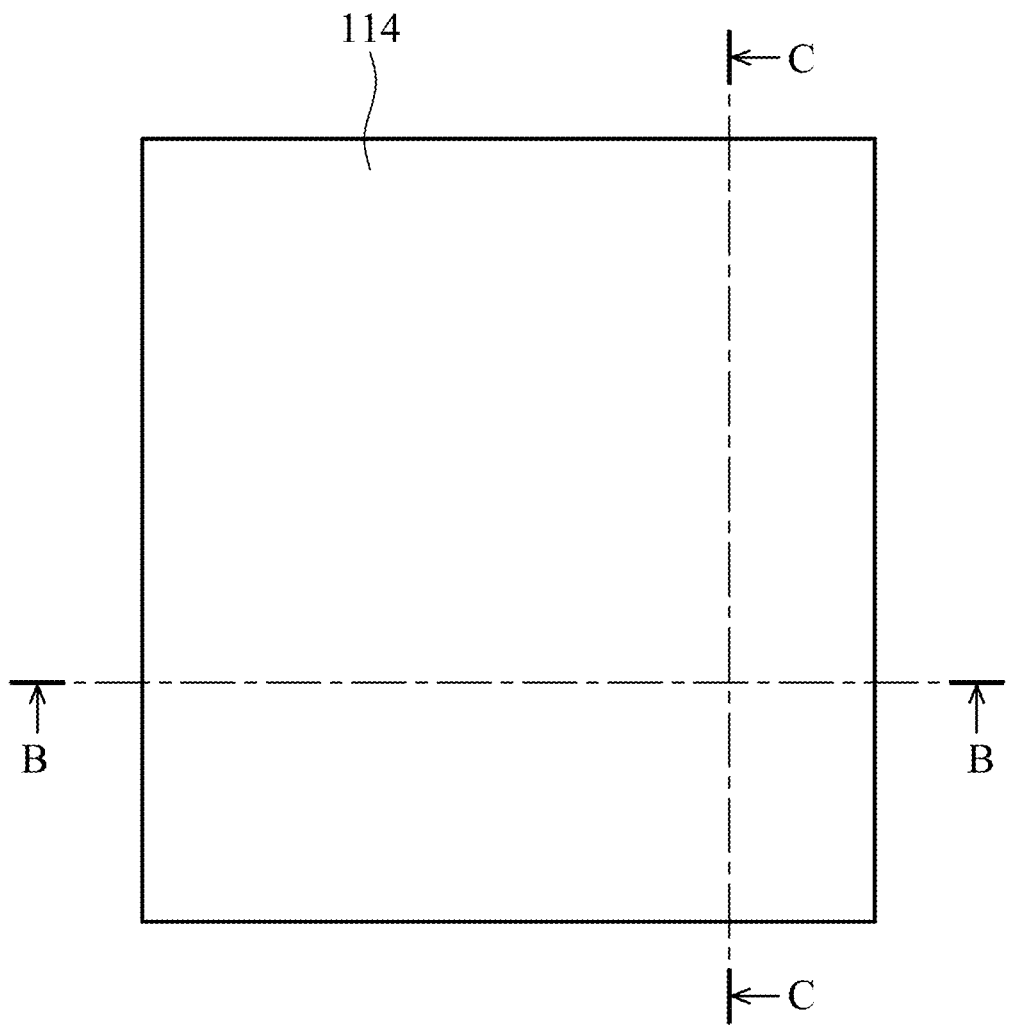
FIG. 1A shows a top view schematically illustrating one of various stages of forming a heterojunction bipolar transistor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a heterojunction bipolar transistor. By forming the electrical contact to the base electrode beyond the base layer, the footprint of the base layer may be reduced and the base-collector contact area may be reduced. Therefore, the base-collector parasitic capacitance of the heterojunction bipolar transistor can be reduced.

Figure 5A:
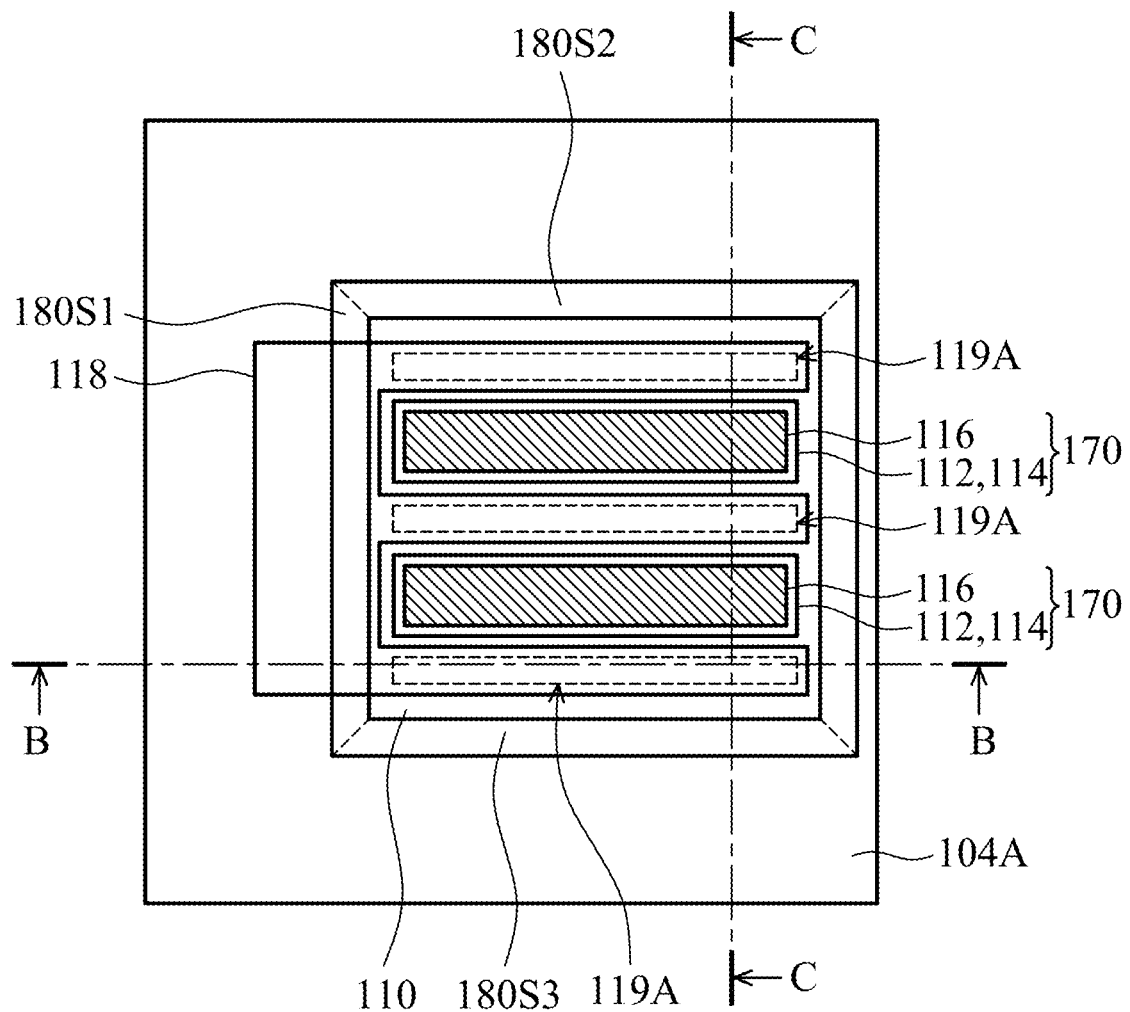
FIG. 5A shows a top view schematically illustrating one of various stages of forming a heterojunction bipolar transistor in accordance with some embodiments.
Figure 5B:
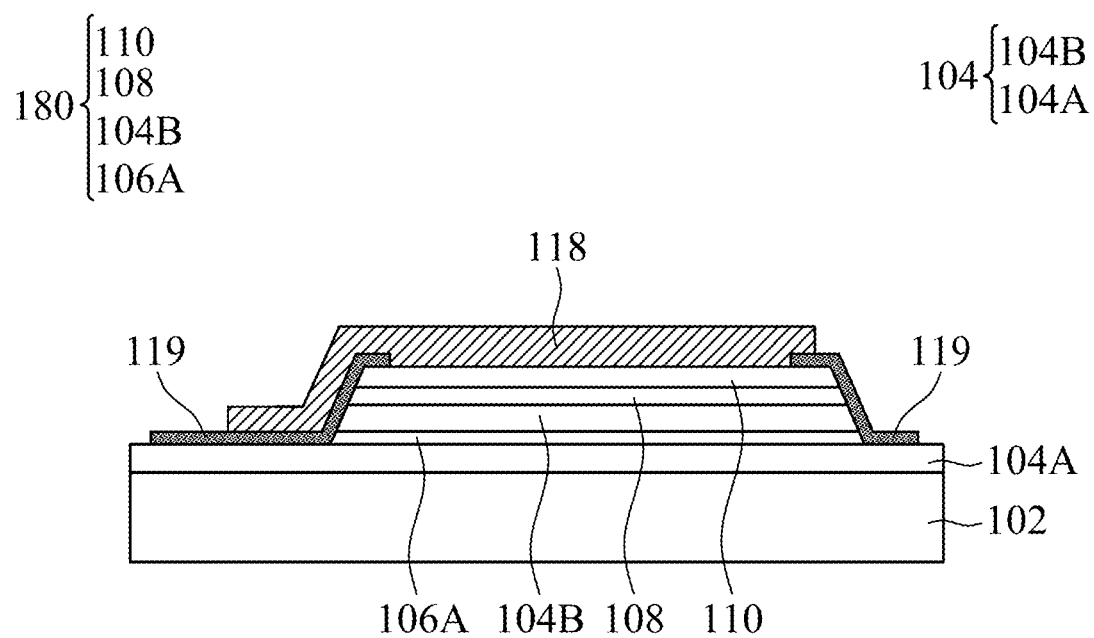
FIG. 5B shows a cross-sectional view along line B-B of FIG. 5A.
Figure 5C:
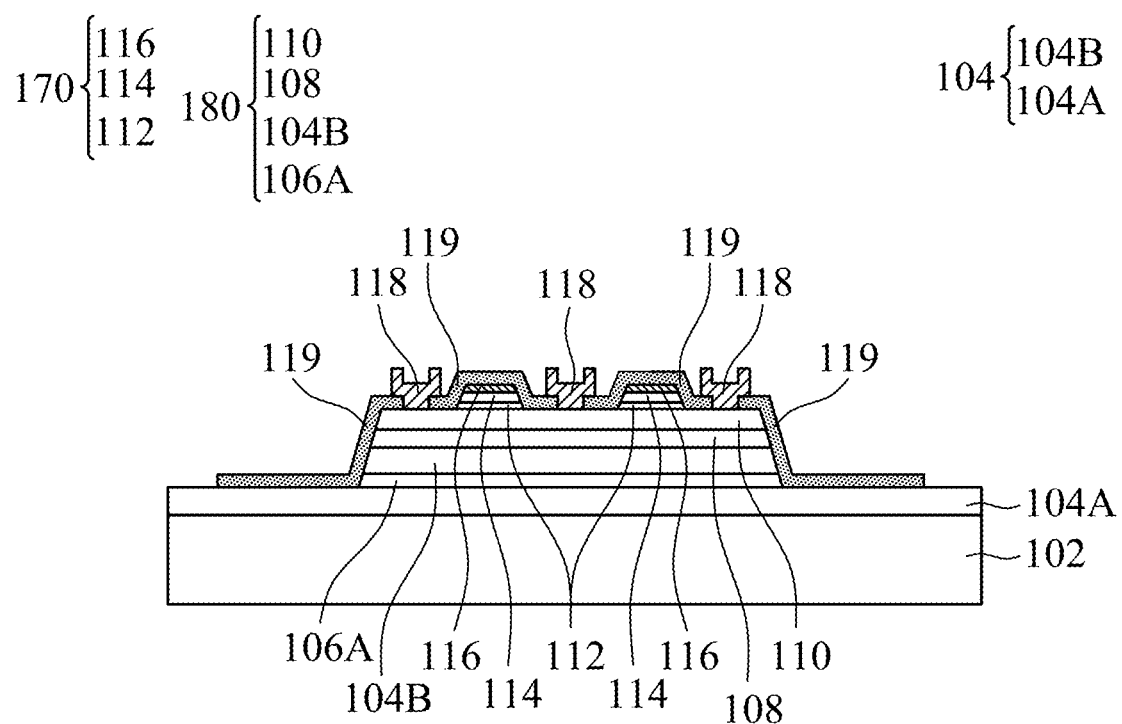
FIG. 5C shows a cross-sectional view along line C-C of FIG. 5A.
Figure 6A:
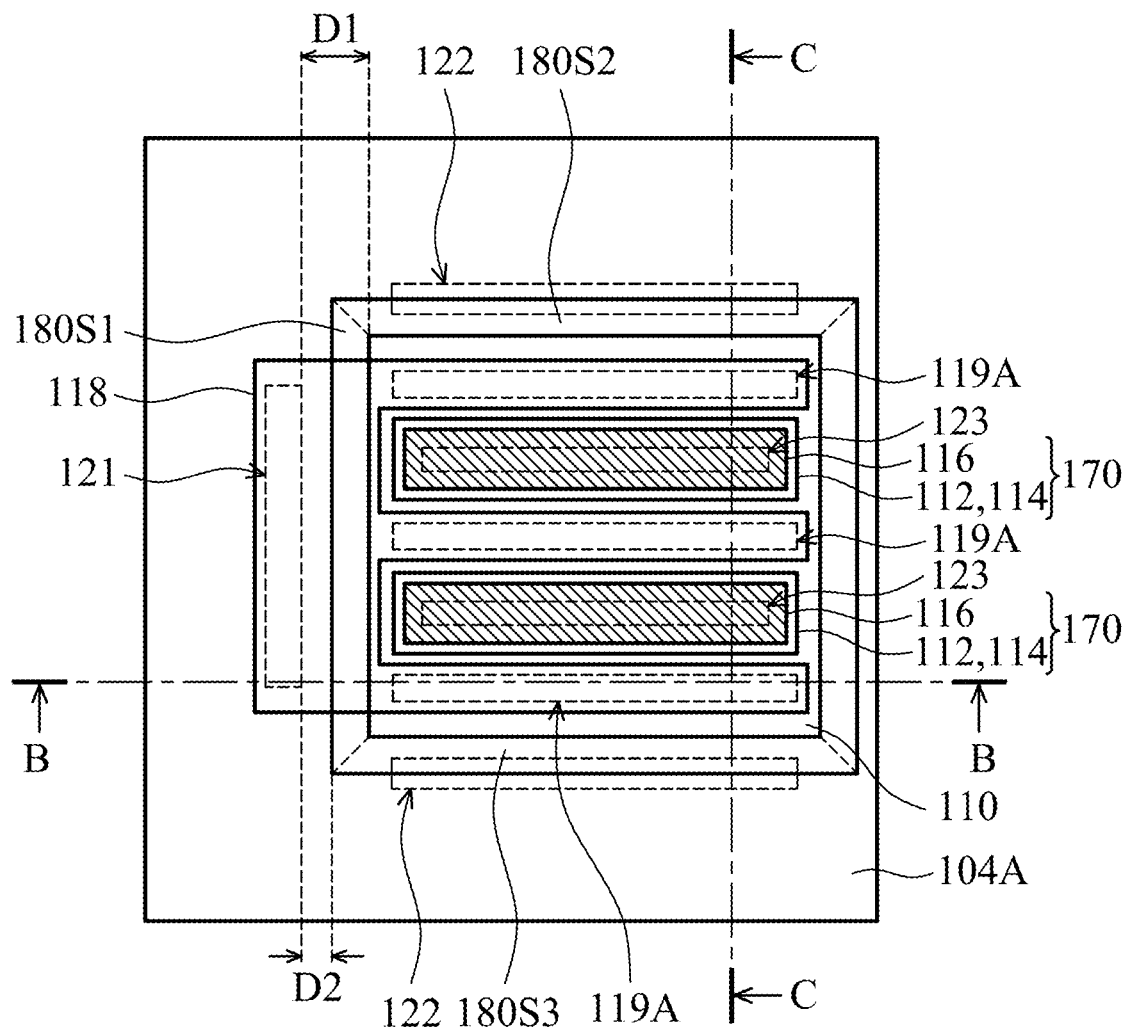
FIG. 6A shows a top view schematically illustrating one of various stages of forming a heterojunction bipolar transistor in accordance with some embodiments.
Figure 6B:
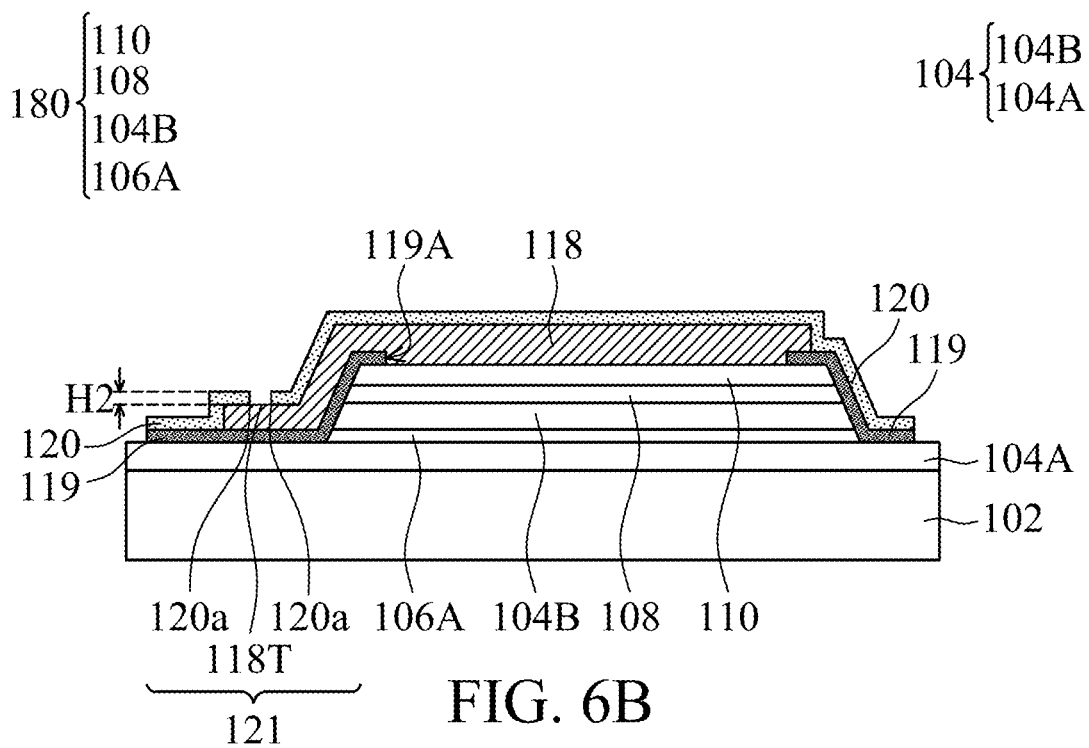
FIG. 6B shows a cross-sectional view along line B-B of FIG. 6A.
Figure 6C:
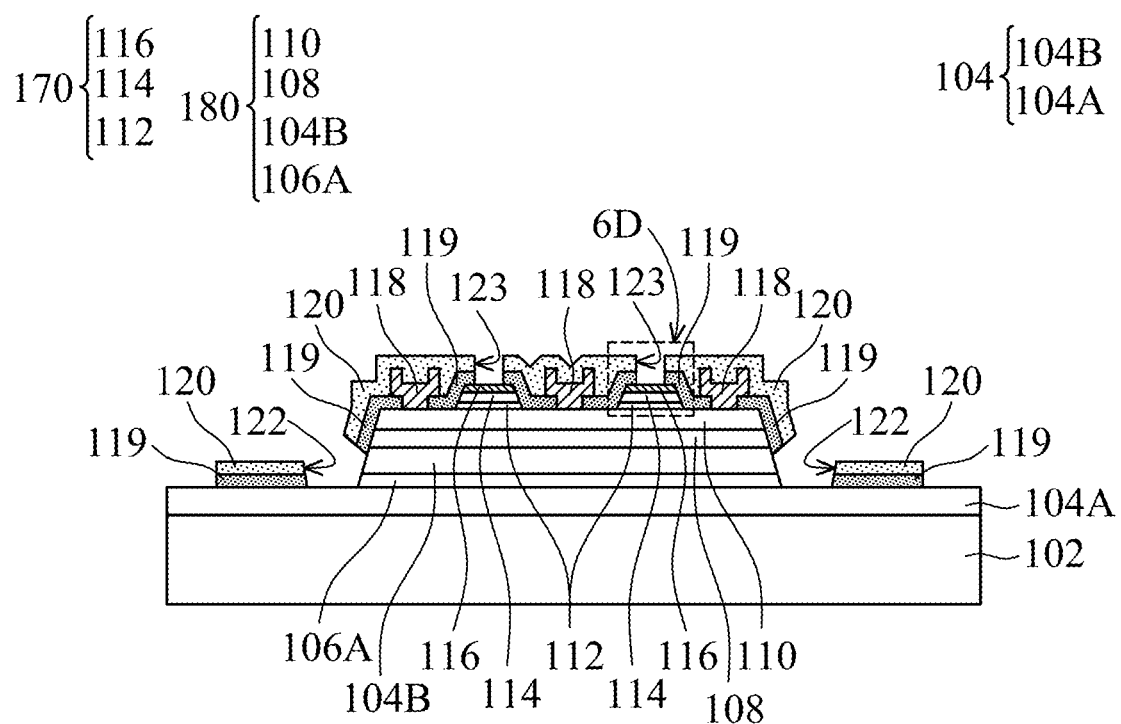
FIG. 6C shows a cross-sectional view along line C-C of FIG. 6A.
Figure 6D:
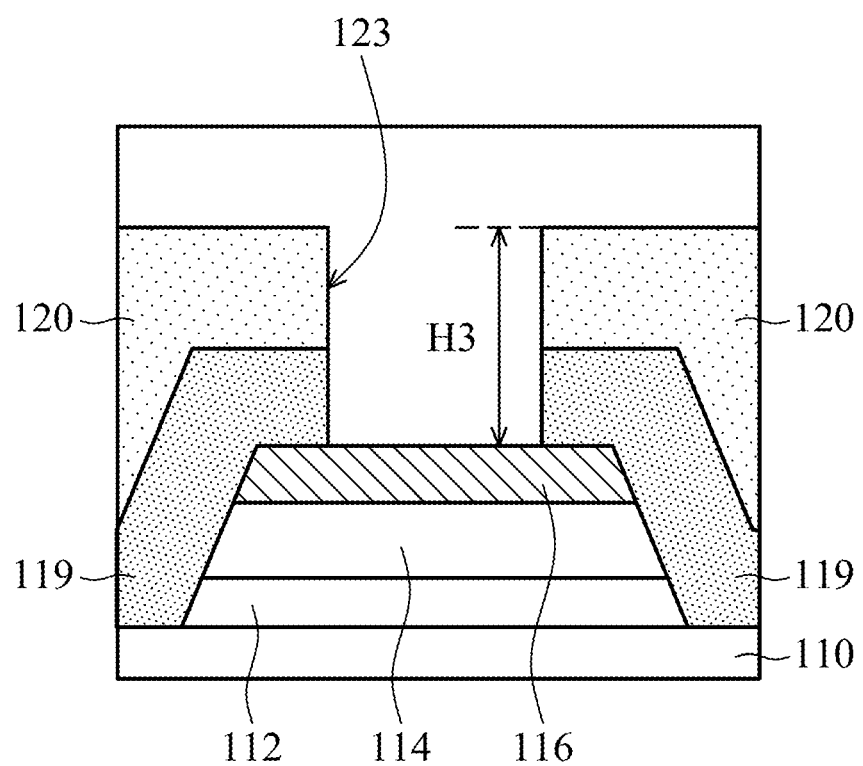
FIG. 6D shows an enlarged view of an area 6D of FIG. 6C.
Figure 7A:
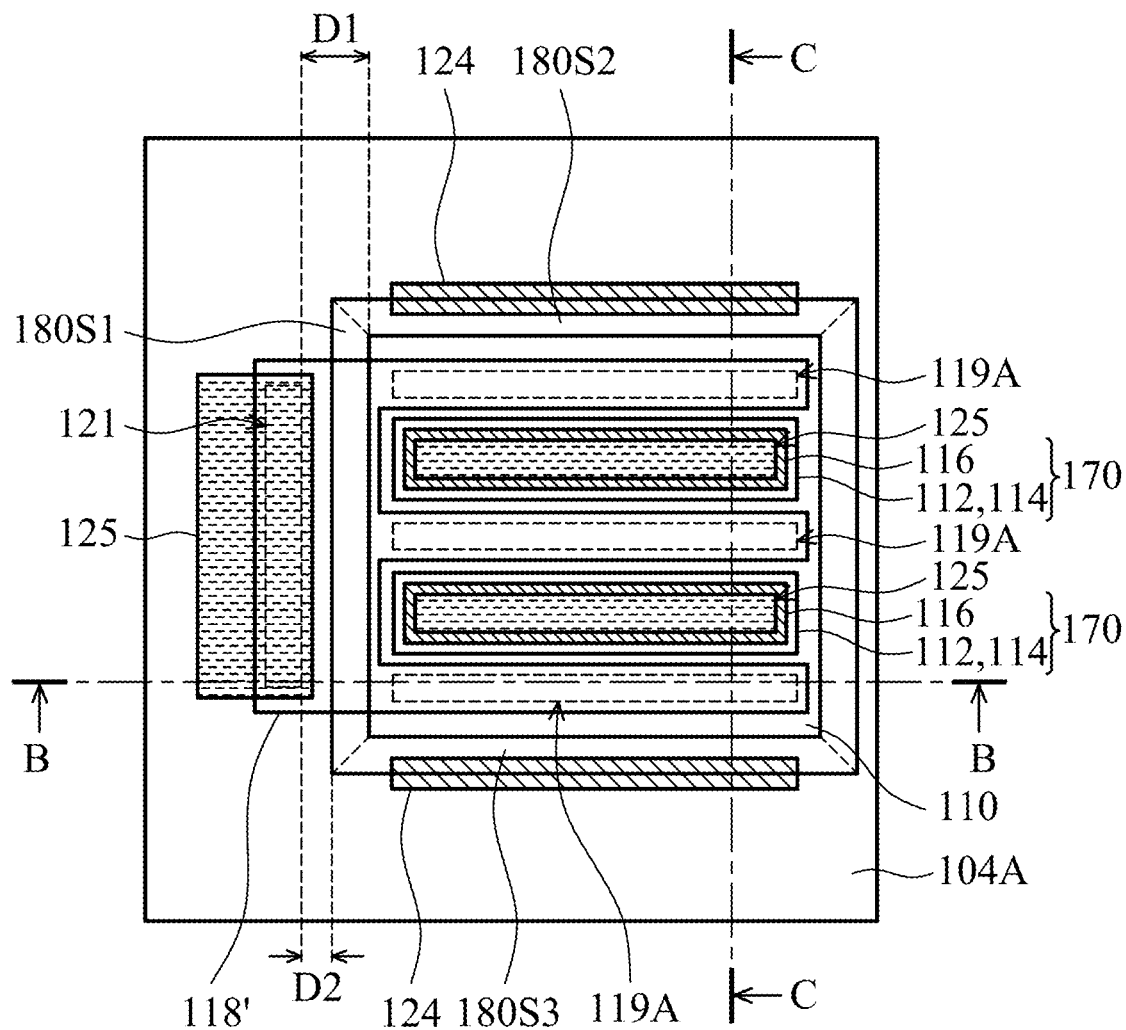
FIG. 7A shows a top view schematically illustrating a heterojunction bipolar transistor in accordance with some embodiments.
Figure 7B:
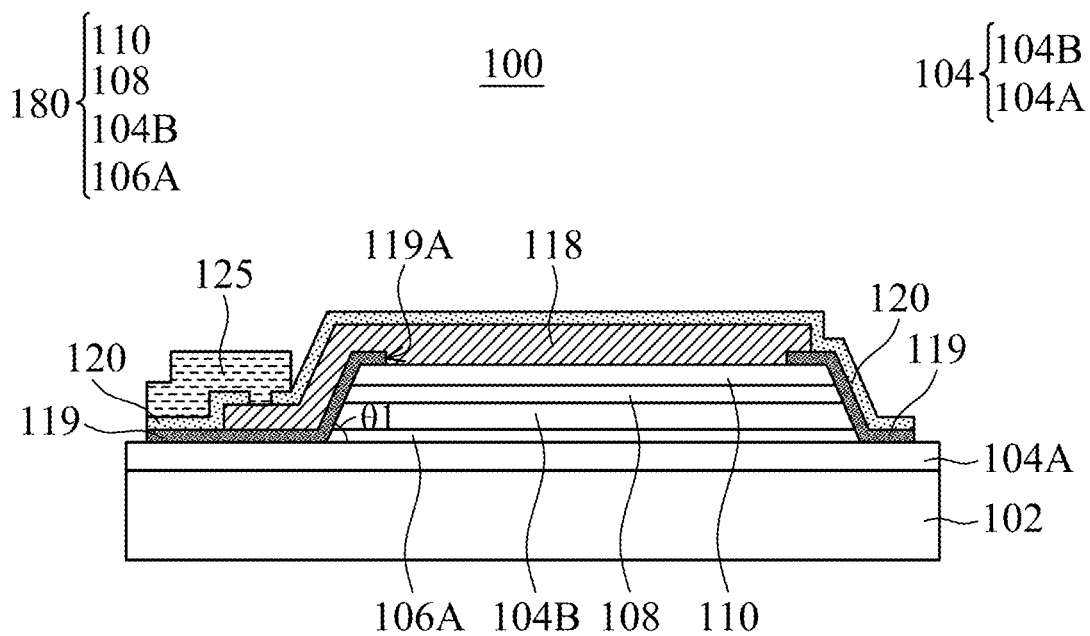
FIG. 7B shows a cross-sectional view along line B-B of FIG. 7A.
Figure 7C:
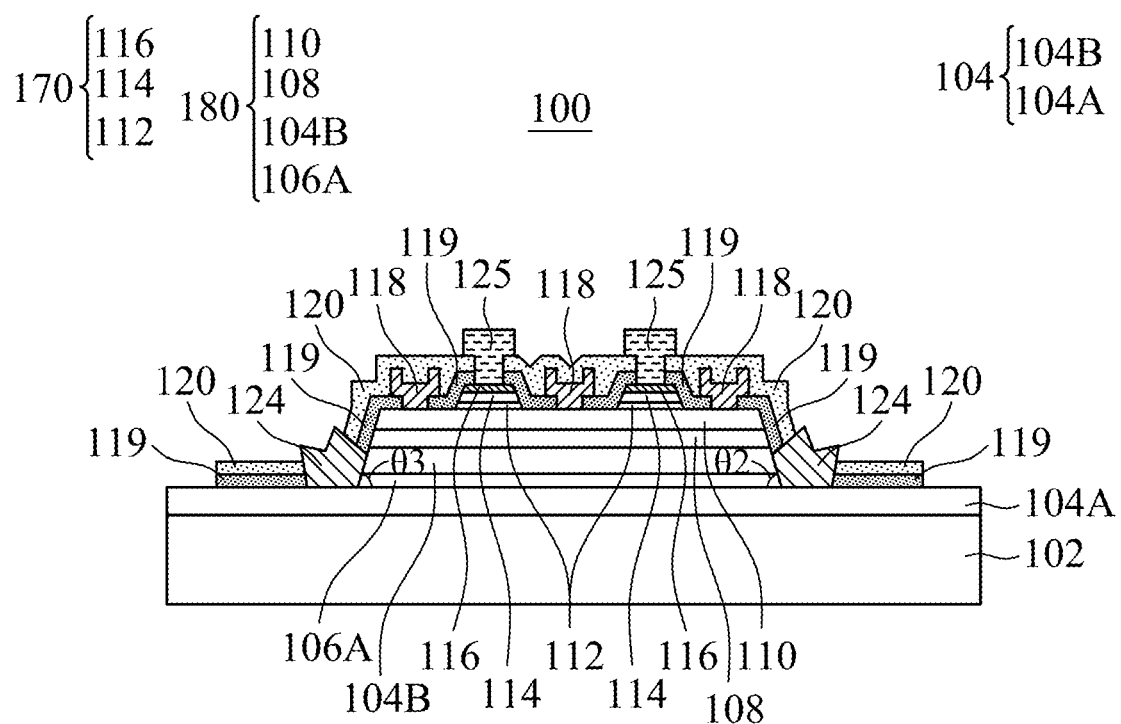
FIG. 7C shows a cross-sectional view along line C-C of FIG. 7A.

FIGS. 1A, 2A, 3A, 4A, 5A and 6A show top views schematically illustrating various stages of forming a heterojunction bipolar transistor (for example, a heterojunction bipolar transistor 100 shown in FIGS. 7A through 7C) in accordance with some embodiments. FIGS. 1B, 2B, 3B, 4B, 5B and 6B show cross-sectional views respectively taken along line B-B of FIGS. 1A, 2A, 3A, 4A, 5A and 6A. FIGS. 1C, 2C, 3C, 4C, 5C and 6C show cross-sectional views respectively taken along line C-C of FIGS. 1A, 2A, 3A, 4A, 5A and 6A. FIG. 6D shows an enlarged view of the area 6D showing one of the third via holes and its periphery structure of FIG. 6C. In some embodiments, line B-B of those top views is substantially perpendicular to line C-C of those top views. In some embodiments, an angle sandwiched by line B-B and line C-C of those top views is between about 45 degrees and about 90 degrees.

Figure 1B:
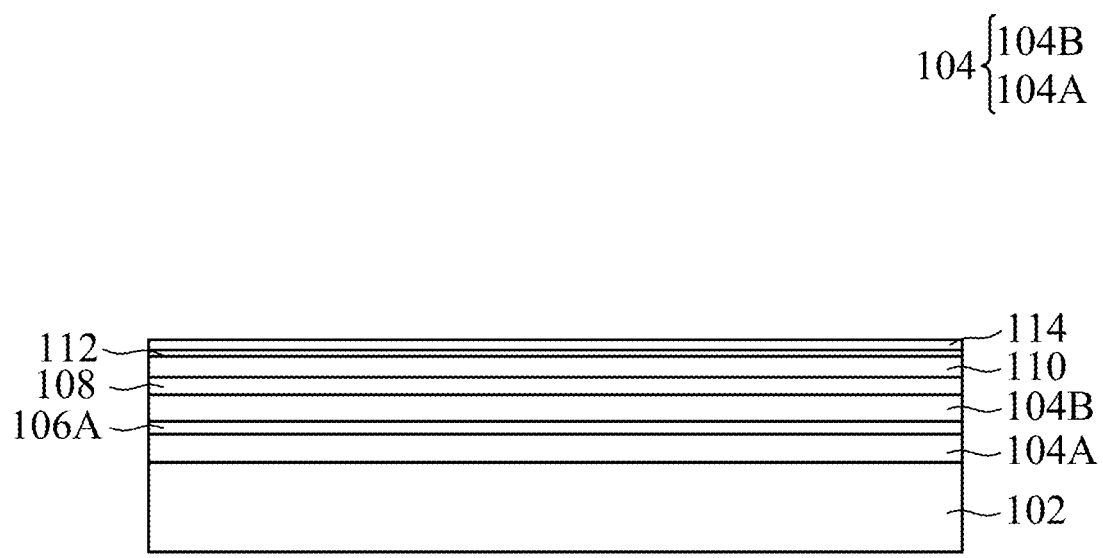
FIG. 1B shows a cross-sectional view along line B-B of FIG. 1A.
Figure 1C:
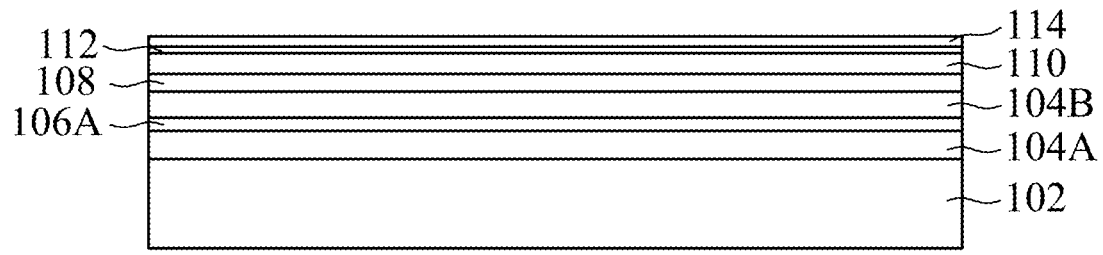
FIG. 1C shows a cross-sectional view along line C-C of FIG. 1A.

As shown in FIGS. 1A through 1C, a heterojunction bipolar transistor 100 (shown in FIGS. 7A through 7C) includes a substrate 102. In some embodiments, the substrate 102 is a semiconductor substrate. Moreover, the substrate 102 may include III-V semiconductors such as GaN, AlGaN, AlN, GaAs, AlGaAs, InP, InAlAs, InGaAs, or a combination thereof. In some embodiments, the substrate 102 includes undoped GaAs.

Next, a bottom sub-collector layer 104A is formed on the substrate 102. In some embodiments, the bottom sub-collector layer 104A includes a III-V semiconductor having a first conductivity type. In some other embodiments, the bottom sub-collector layer 104A includes a III-V semiconductor having a second conductivity type. The second conductivity type is opposite to the first conductivity type. In some embodiments, the first conductivity type is n-type. The bottom sub-collector layer 104A may include III-V semiconductors such as GaN, AlGaN, AlN, GaAs, AlGaAs, InP, InAlAs, InGaAs, or a combination thereof. In some embodiments, the bottom sub-collector layer 104A is an n-type GaAs layer which may be doped by Si, Se, and Te. In some embodiments, the doping concentration of the bottom sub-collector layer 104A is in a range of between 1e18 $cm^{-3}$ to 1e20 cm$^{-3}$. In some embodiments, the doping concentration of the bottom sub-collector layer 104A is 5e18 cm$^{-3}$. With doping concentration of this order, it may be easier to form an ohmic contact between the bottom sub-collector layer 104A and subsequently formed collector electrode. If the doping concentration of the bottom sub-collector layer 104A is too high, the dopant may not be activated completely and the reliability may be worse. If the doping concentration of the bottom sub-collector layer 104A is too low, an ohmic contact may not be formed between the bottom sub-collector layer 104A and subsequently formed collector electrode. In some embodiments, the bottom sub-collector layer 104A may have a thickness of between 50 nm and 1500 nm. In some embodiments, the bottom sub-collector layer 104A has a thickness of between 100 nm and 1000 nm. In some embodiments, the bottom sub-collector layer 104A has a thickness of between 100 nm and 800 nm. If the bottom sub-collector layer 104A is too thick, it may be difficult for isolation by implantation. If the bottom sub-collector layer 104A is too thin, the collector resistance may increase. In some embodiments, the bottom sub-collector layer 104A is formed on the substrate 102 by molecular-beam epitaxy (MBE), metalorganic chemical vapor deposition (MOCVD), chemical vapor deposition (CVD), hydride vapor phase epitaxy (HVPE), another suitable method, or a combination thereof. The bottom sub-collector layer 104A may be doped by in-situ doping.

Next, an etch stop layer 106A is optionally formed on the bottom sub-collector layer 104A, in accordance with some embodiments. In some embodiments, the etch stop layer 106A includes InGaP, InGaAs, GaAsP, AlGaAs, InAlAs, GaSb or a combination thereof. In some embodiments, the etch stop layer 106A has a doping concentration in the same order with the doping concentration of the bottom sub-collector layer 104A. In these embodiments, the doping concentration of the etch stop layer 106A is in a range of between 1e18 cm$^{-3}$ to 1e20 cm$^{-3}$. If the doping concentration of the etch stop layer 106A is too high, the dopant may not be activated completely and the reliability may be worse. If the doping concentration of the etch stop layer 106A is too low, the collector resistance may increase. In some embodiments, the etch stop layer 106A may have a thickness of between 5 nm and 200 nm. In some embodiments, the etch stop layer 106A has thickness of between 5 nm and 50 nm. If the etch stop layer 106A is too thick, the collector resistance may increase. If the etch stop layer 106A is too thin, it may not be sufficient to make subsequent etching process stop. The etch stop layer 106A may be formed by molecular-beam epitaxy (MBE), metalorganic chemical vapor deposition (MOCVD), chemical vapor deposition (CVD), hydride vapor phase epitaxy (HVPE), another suitable method, or a combination thereof. The etch stop layer 106A may be doped by in-situ doping.

Next, an upper sub-collector layer 104B is formed on the etch stop layer 106A (if existed) or the bottom sub-collector layer 104A. In some embodiments, the upper sub-collector layer 104B has a thickness of between 50 nm and 1500 nm. In some embodiments, the upper sub-collector layer 104B has a thickness of between 100 nm and 1000 nm. In some embodiments, the upper sub-collector layer 104B has a thickness of between 100 nm and 800 nm. In some embodiments, the thickness of the upper sub-collector layer 104B and the thickness of the bottom sub-collector layer 104A are substantially the same. The thickness ratio of the upper sub-collector layer 104B to the bottom sub-collector layer 104A may determine the shape and location of the subsequently formed collector electrode. In some embodiments, the upper sub-collector layer 104B is in direct contact with the subsequently formed collector electrode. In some embodiments, the doping concentration of the upper sub-collector layer 104B is in a range of between 1e18 cm$^{-3}$ to 1e20 cm$^{-3}$. In some embodiments, the doping concentration of the upper sub-collector layer 104B is 5e18 cm$^{-3}$. With doping concentration of this order, it may be easier to form an ohmic contact between the upper sub-collector layer 104B and the subsequently formed collector electrode. If the doping concentration of the upper sub-collector layer 104B is too high, the dopant may not be activated completely and the reliability may be worse. If the doping concentration of the upper sub-collector layer 104B is too low, an ohmic contact may not be formed between the upper sub-collector layer 104B and subsequently formed collector electrode. In some embodiments, the doping concentrations of the upper sub-collector layer 104B and the bottom sub-collector layer 104A are substantially the same. In some other embodiments, the doping concentration of the upper sub-collector layer 104B and the bottom sub-collector layer 104A are different. As long as the doping concentrations are high enough, ohmic contact may be formed between the upper sub-collector layer 104B, the bottom sub-collector layer 104A, and the subsequently formed collector electrode. Materials and processes used to form the upper sub-collector layer 104B may be similar to, or the same as, those used to form the bottom sub-collector layer 104A described previously and are not repeated herein for brevity.

It should be noted that since the formation of an etch stop layer 106A is optional, the upper sub-collector layer 104B may be made of the same material and at the same time as the bottom sub-collector layer 104A, which may reduce production cost and time. The upper sub-collector layer 104B and the bottom sub-collector layer 104A may be referred to as a sub-collector layer 104.

Next, a collector layer 108 is formed on the upper sub-collector layer 104B, in accordance with some embodiments. In some embodiments, the collector layer 108 includes a III-V semiconductor having a first conductivity type. The collector layer 108 may include III-V semiconductors such as GaN, AlGaN, AlN, GaAs, AlGaAs, InP, InAlAs, InGaAs, GaSb, or a combination thereof. In some embodiments, the collector layer 108 is an n-type GaAs layer. The collector layer 108 may be formed by molecular-beam epitaxy (MBE), metalorganic chemical vapor deposition (MOCVD), chemical vapor deposition (CVD), hydride vapor phase epitaxy (HVPE), another suitable method, or a combination thereof. In some embodiments, the doping concentration of the collector layer 108 is more than 0 cm$^{-3}$, and equal to or less than 1e18 cm$^{-3}$. In some embodiments, the doping concentration of the collector layer 108 is in a range of between 1e14 cm$^{-3}$ to 1e18 cm$^{-3}$. In some embodiments, the doping concentration of the collector layer 108 is in a range of between 1e14 cm$^{-3}$ to 1e17 cm$^{-3}$. In some embodiments, the doping concentration of the collector layer 108 is in a range of between 1e14 cm$^{-3}$ to 3e17 cm$^{-3}$. In some embodiments, the doping concentration of the collector layer 108 is in a range of between 1e14 cm$^{-3}$ to 5e17 cm$^{-3}$. In some embodiments, the doping concentration of the collector layer 108 is in a range of between 1e14 cm$^{-3}$ to 8e17 cm$^{-3}$. The collector layer 108 may be a multi-layer structure with different doping concentration. Since the doping concentration of the collector layer 108 is lower than the upper sub-collector layer 104B, if the subsequently formed collector electrode is in contact with the collector layer 108, a Schottky contact, not an ohmic contact, may be formed between the collector layer 108 and the subsequently formed collector electrode.

Next, a base layer 110 is formed on the collector layer 108, in accordance with some embodiments. In some embodiments, the base layer 110 includes a III-V semiconductor having a second conductivity type. The base layer 110 may include III-V semiconductors such as GaN, AlGaN, AlN, GaAs, AlGaAs, InP, InAlAs, InGaAs, GaSb or a combination thereof. In some embodiments, the base layer 110 is a highly doped p-type GaAs layer which may be doped by C, Mg, Zn, Ca, Be, Sr, Ba, and Ra. The doping concentration of the base layer 110 may be in a range of between 1e18 cm$^{-3}$ to 1e20 cm$^{-3}$. The base layer 110 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, an emitter layer 112 is formed on the base layer 110, in accordance with some embodiments. In some embodiments, the emitter layer 112 includes a III-V semiconductor having a first conductivity type. The emitter layer 112 may include III-V semiconductors such as GaN, AlGaN, AlN, GaAs, AlGaAs, InP, InAlAs, InGaAs, or a combination thereof. In some embodiments, the emitter layer 112 is an n-type InGaP layer. The emitter layer 112 may be a multilayer structure. In some embodiments, the emitter layer 112 includes an n-type InGaP layer at the bottom and an n-type GaAs layer at the top (not shown.) In some embodiments, the material of the emitter layer 112 and the material of the base layer 110 are different materials with different band gaps. Therefore, a heterojunction may be formed at the interface between the emitter layer 112 and the base layer 110. The emitter layer 112 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, an emitter cap layer 114 is formed on the emitter layer 112, in accordance with some embodiments. In some embodiments, the emitter cap layer 114 includes a III-V semiconductor having a first conductivity type. The emitter cap layer 114 may include III-V semiconductors such as GaN, AlGaN, AlN, GaAs, AlGaAs, InP, InAlAs, InGaAs, or a combination thereof. In some embodiments, the emitter cap layer 114 is a highly doped n-type InGaAs layer which may help to form ohmic contact between the emitter cap layer 114 and the subsequently formed emitter electrode. The emitter cap layer 114 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Figure 2A:
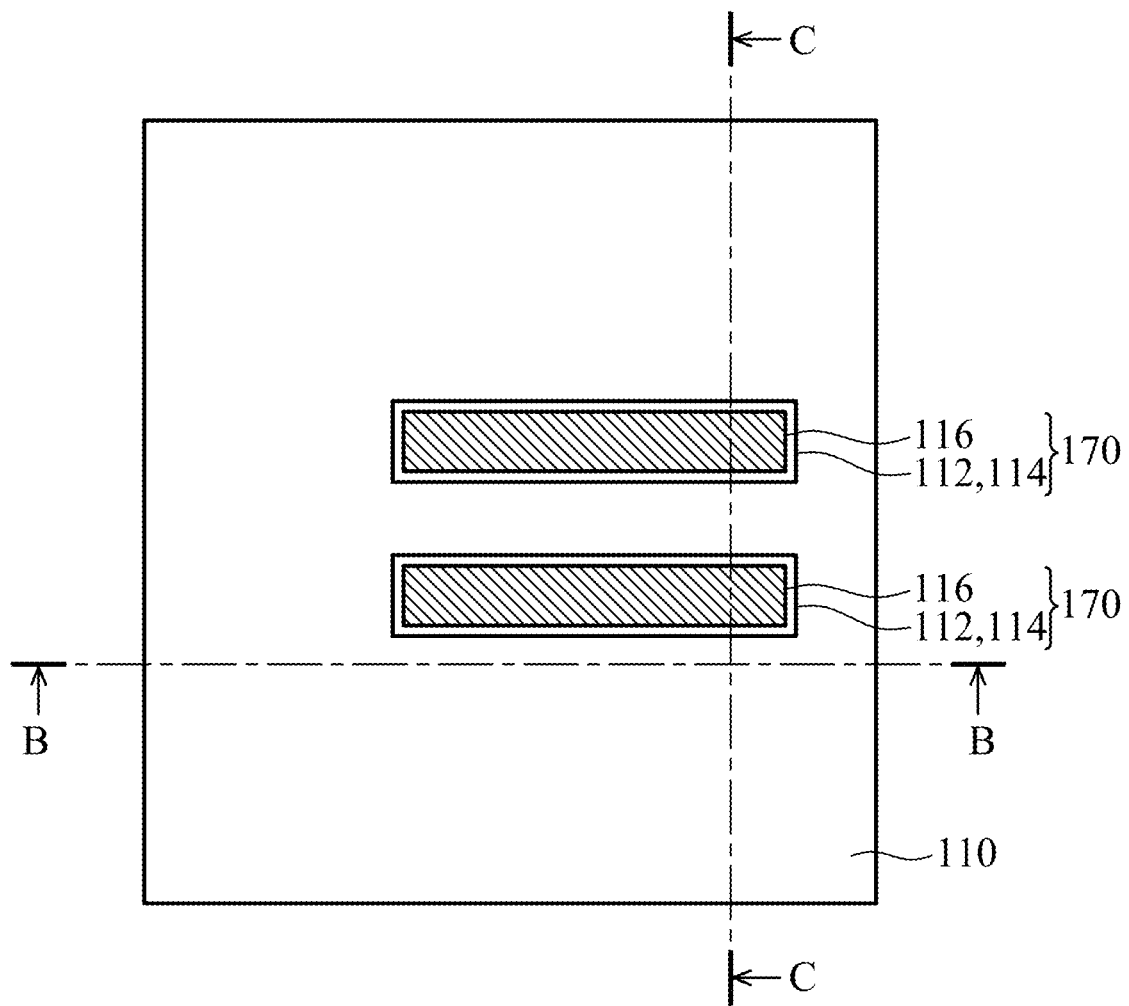
FIG. 2A shows a top view schematically illustrating one of various stages of forming a heterojunction bipolar transistor in accordance with some embodiments.
Figure 2B:
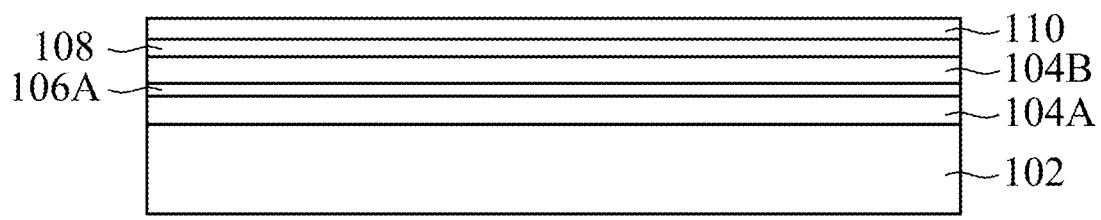
FIG. 2B shows a cross-sectional view along line B-B of FIG. 2A.
Figure 2C:
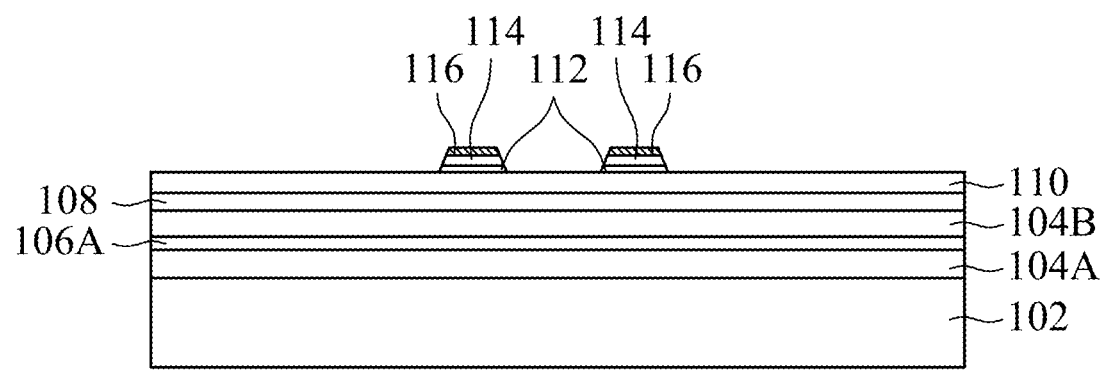
FIG. 2C shows a cross-sectional view along line C-C of FIG. 2A.

Next, as shown in FIGS. 2A through 2C, an emitter electrode 116 is formed on the emitter cap layer 114, in accordance with some embodiments. The emitter electrode 116 may include Ti, Al, Au, Pd, Pt, Cu, W, other suitable metal, its alloy, or a combination thereof. An emitter electrode material may be formed on the emitter cap layer 114 first by electroplating, sputtering, resistive heating evaporation, physical vapor deposition (PVD), chemical vapor deposition (CVD), atomic layer deposition (ALD), another suitable method, or a combination thereof. In some embodiments, the electrode material is then patterned by a photolithography and an etching process, and the emitter electrode 116 is formed.

After the emitter electrode 116 is formed, the emitter cap layer 114 and the emitter layer 112 are then patterned by a photolithography and an etching process, in accordance with some embodiments. The patterning process may include photoresist coating (such as spin-on coating), soft baking, mask aligning, pattern exposure, post-exposure baking, photoresist development, rinsing and drying (such as hard baking), other suitable techniques, or a combination thereof. The etching process may include a dry etching process (such as reactive ion etching (RIE) or an anisotropic plasma etching method), wet etching, or a combination thereof. As a result, a mesa 170 of the emitter electrode 116, the emitter cap layer 114 and the emitter layer 112 is formed. In FIG. 2A and the subsequent top views, the emitter cap layer 114 and the emitter layer 112 of the mesa 170 are collectively shown for clarity.

Figure 3A:
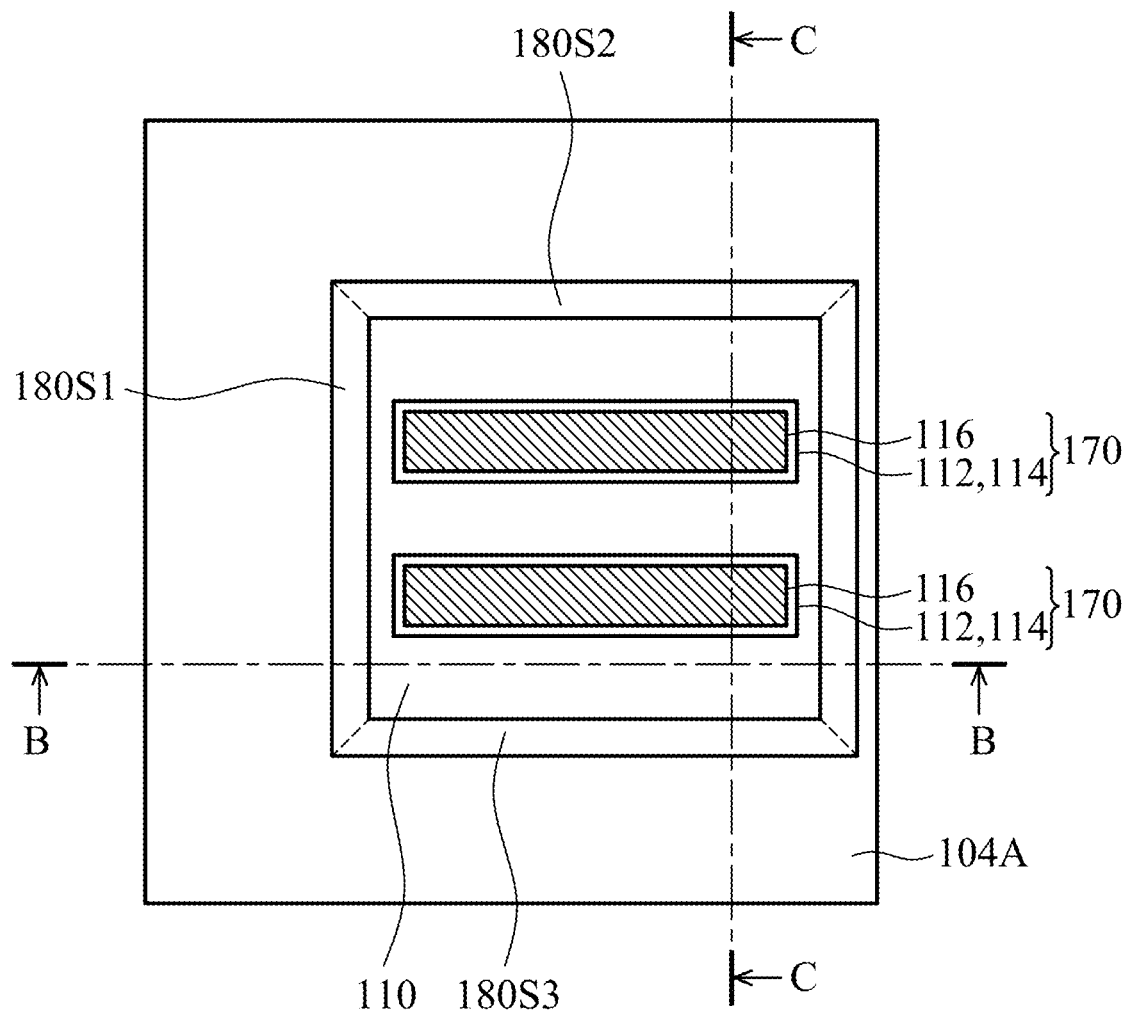
FIG. 3A shows a top view schematically illustrating one of various stages of forming a heterojunction bipolar transistor in accordance with some embodiments.
Figure 3B:
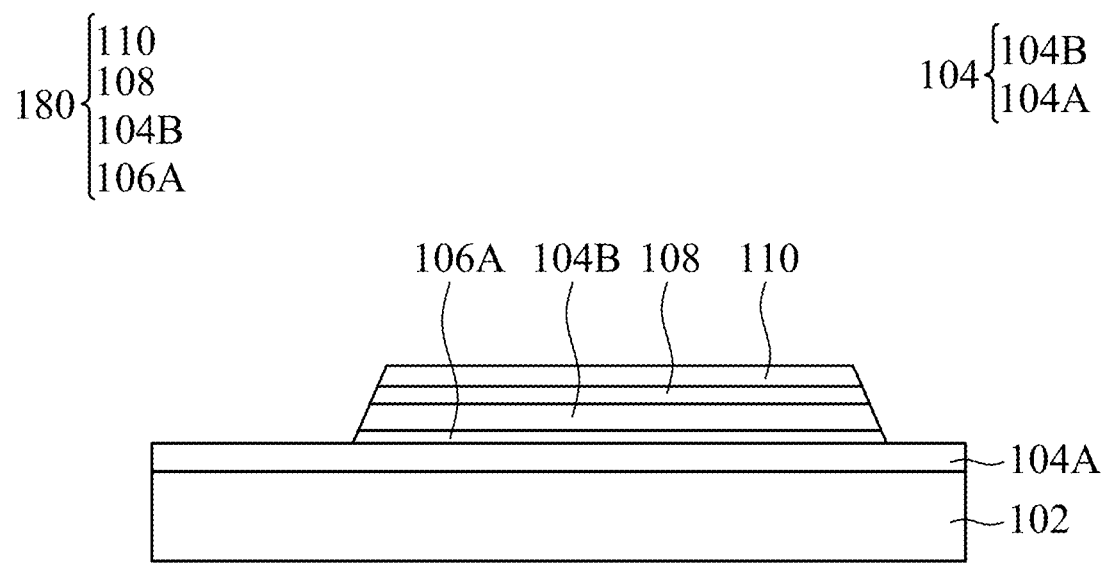
FIG. 3B shows a cross-sectional view along line B-B of FIG. 3A.
Figure 3C:
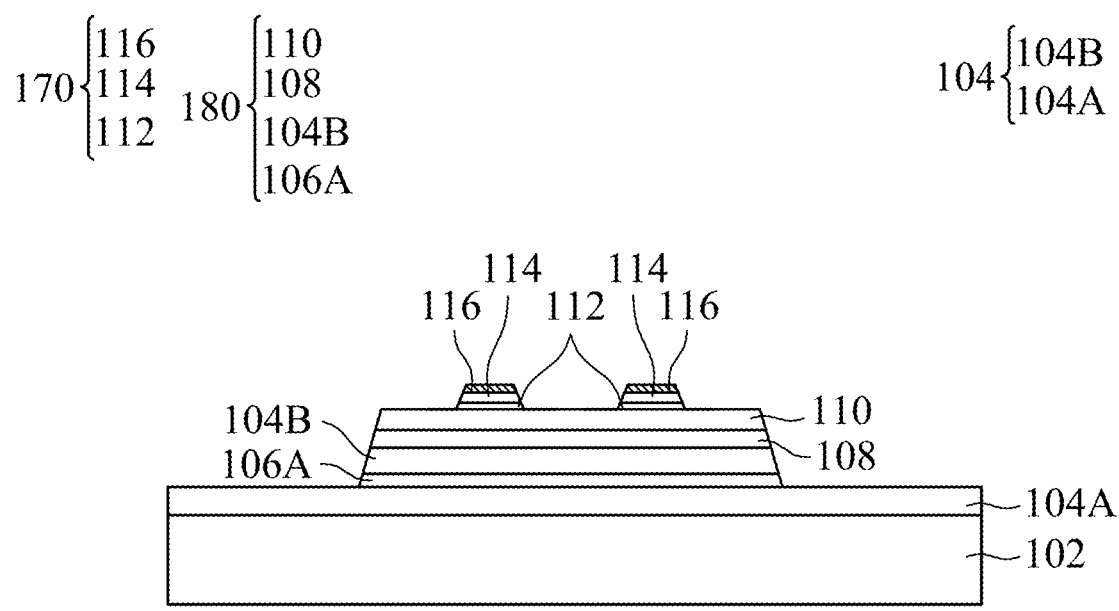
FIG. 3C shows a cross-sectional view along line C-C of FIG. 3A.

Next, as shown in FIGS. 3A through 3C, the base layer 110, the collector layer 108, the upper sub-collector layer 104B are patterned by a photolithography and an etching process to form a mesa 180 of the base layer 110, the collector layer 108, and the upper sub-collector layer 104B, in accordance with some embodiments. As shown in FIGS. 3B and 3C, the etching stops at the etch stop layer 106A, in accordance with some embodiments. Therefore, the etch stop layer 106A may protect the bottom sub-collector layer 104A from being over-etched, resulting in a uniform thickness of the bottom sub-collector layer 104A. In some embodiments, the etch stop layer 106A which is optionally formed and remained after the photolithography and the etching process is included in the mesa 180.

In some embodiments, the base layer 110, the collector layer 108, the upper sub-collector layer 104B and the etch stop layer 106A of the mesa 180 is formed by performance of an isotropic process such as a wet etching process. The wet etching process may be performed in wet etching etchant including diluted hydrofluoric acid (DHF), potassium hydroxide (KOH), ammonia, hydrofluoric acid (HF), nitric acid (HNO$_3$), and/or acetic acid (CH$_3$COOH), other suitable wet etching etchant, or a combination thereof. In some embodiments, as shown in FIGS. 3A through 3C, the mesa 180 has tapered sidewalls relative to the bottom surface of the upper sub-collector layer 104B or the etch stop layer 106A (if formed).

In some embodiments, the etching of the base layer 110 and the collector layer 108 and the etching of the upper sub-collector layer 104B may be different. For example, the etching of the base layer 110 and the collector layer 108 may be an anisotropic process such as a dry etching process. The dry etching process may be performed by an oxygen-containing gas, a fluorine-containing gas (such as CF$_4$, SF$_6$, CH$_2$F$_2$, CHF$_3$, and/or C$_2$F$_6$), a chlorine-containing gas (such as Cl$_2$, CHCl$_3$, CCl$_4$, and/or BCl$_3$), bromine-containing gas (such as HBr and/or CHBR$_3$), iodine-containing gas, other suitable gas and/or plasma, or a combination thereof. Therefore, the base layer 110 and the collector layer 108 may have a sidewall perpendicular (not shown) to the bottom surface of the collector layer 108. On the other hand, the etching of the upper sub-collector layer 104B may be an isotropic process such as a wet etching process. The wet etching process may be performed in wet etching etchant including diluted hydrofluoric acid (DHF), potassium hydroxide (KOH), ammonia, hydrofluoric acid (HF), nitric acid (HNO$_3$), and/or acetic acid (CH$_3$COOH), other suitable wet etching etchant, or a combination thereof. Therefore, the upper sub-collector layer 104B may have a tapered sidewall which is not perpendicular to the bottom surface of the upper sub-collector layer 104B or the etch stop layer 106A (if formed).

It should be noted that the shape of the upper sub-collector layer 104B is merely an example and the upper sub-collector layer 104B in the present embodiment is not limited thereto. The etching of the upper sub-collector layer 104B may also be an anisotropic process and therefore the upper sub-collector layer 104B may have a straight sidewall (not shown).

Figure 4A:
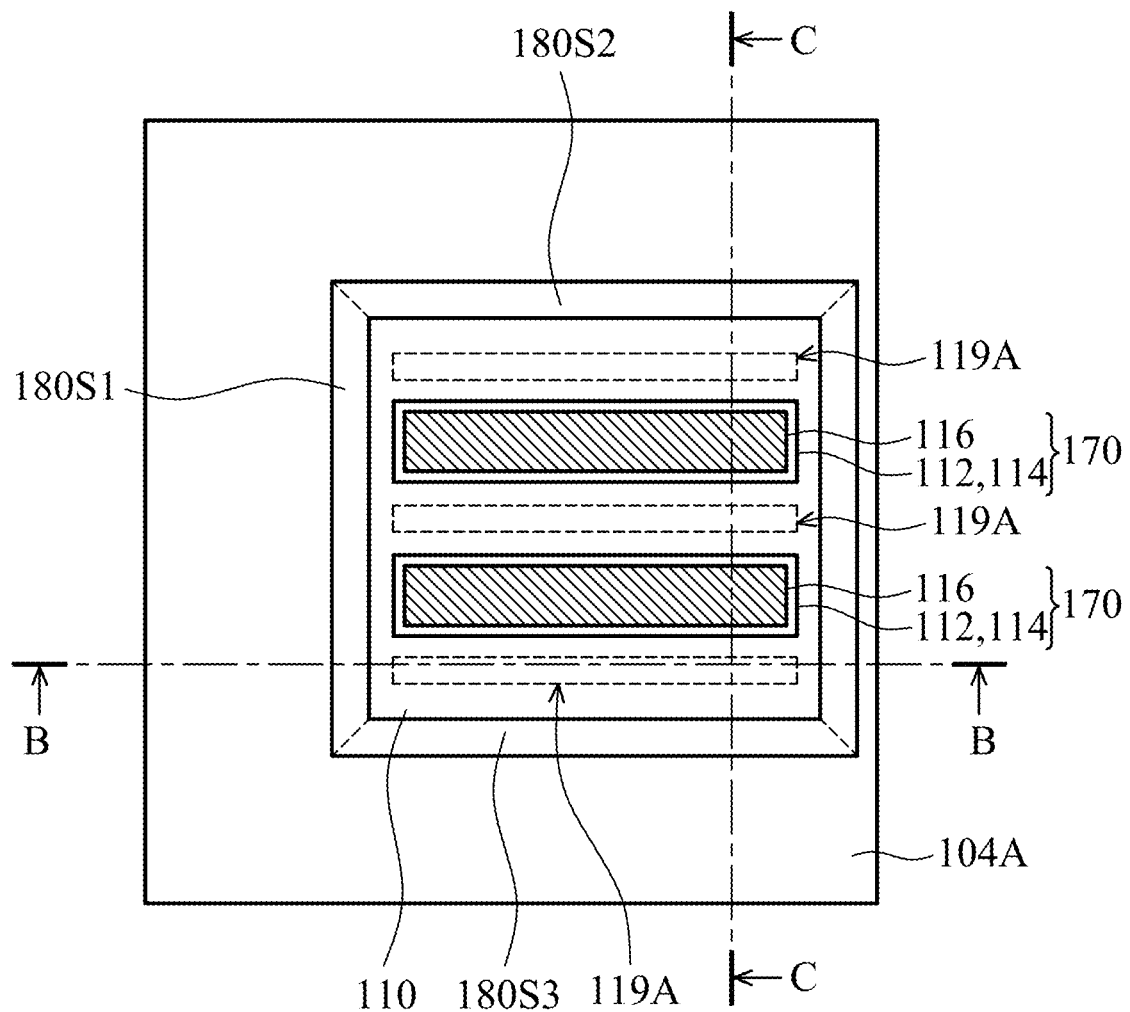
FIG. 4A shows a top view schematically illustrating one of various stages of forming a heterojunction bipolar transistor in accordance with some embodiments.
Figure 4B:
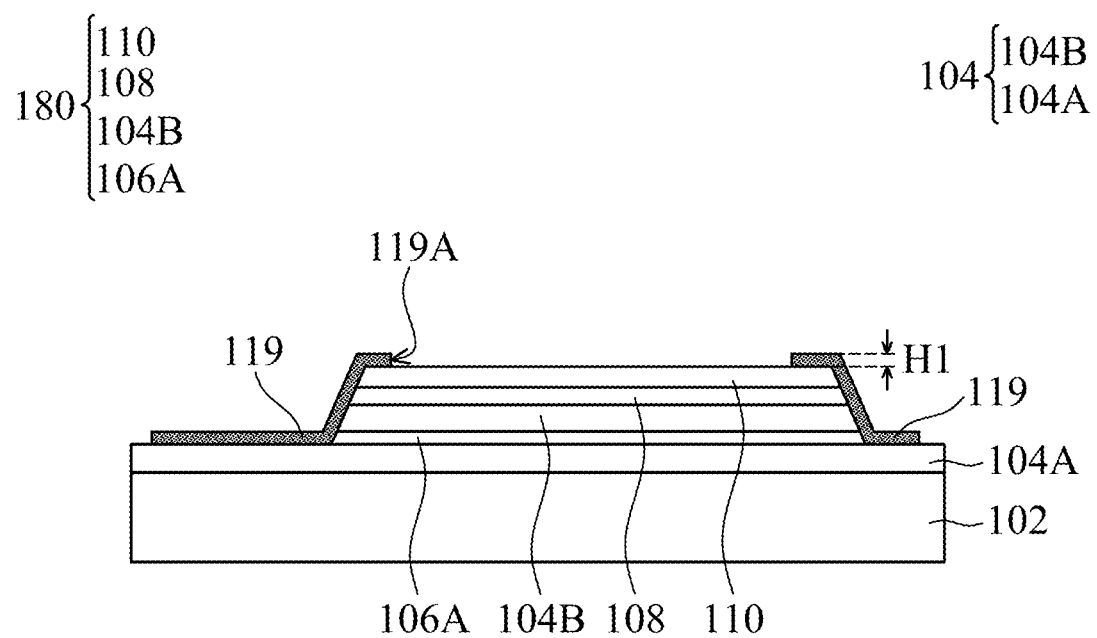
FIG. 4B shows a cross-sectional view along line B-B of FIG. 4A.
Figure 4C:
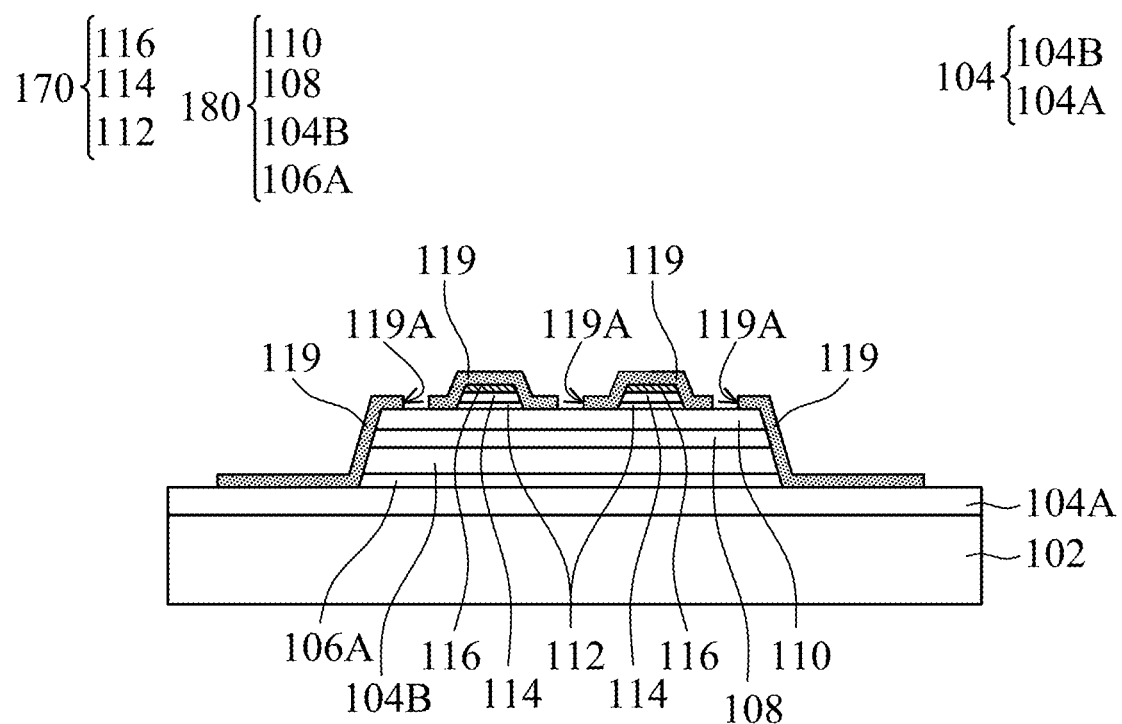
FIG. 4C shows a cross-sectional view along line C-C of FIG. 4A.

Next, as shown in FIGS. 4B and 4C, a first dielectric film 119 is formed over the bottom sub-collector layer 104A, in accordance with some embodiments. In some embodiments, the first dielectric film 119 is further formed to extend over the etch stop layer 106A (if formed), the upper sub-collector layer 104B, the collector layer 108, the base layer 110, the emitter layer 112, the emitter cap layer 114, and the emitter electrode 116. In some embodiments, the first dielectric film 119 covers the mesa 170 and the mesa 180. It should be noted that the first dielectric film 119 is shown as a transparent film in FIG. 4A for the clarity to show the underlying layers. When the first dielectric film 119 is really shown, only the first dielectric film 119 and structures exposed by subsequently formed first via holes 119A can be seen in the top view in some embodiments.

The first dielectric film 119 may include $SiN_x$ (x may be between 1 and 3, and specifically SiN, $Si_3N_4$, $Si_2N_3$ or a combination thereof), $SiO_2$, SiON, $Al_2O_3$, AlN, polyimide (PI), benzocyclobutene (BCB), or polybenzoxazole (PBO), other insulating materials, or a combination thereof. The first dielectric film 119 may be formed by metalorganic chemical vapor deposition (MOCVD), chemical vapor deposition (CVD), spin-coating, another suitable method, or a combination thereof. In some embodiments, the first dielectric film 119 is conformally formed on the bottom sub-collector layer 104A, the upper sub-collector layer 104B, the collector layer 108, the base layer 110, the emitter layer 112, the emitter cap layer 114, and the emitter electrode 116. The first dielectric film 119 may protect the layers below, and provide physical isolation and structure support.

Next, also referring to FIGS. 4A through 4C, at least one first via hole 119A is formed in the first dielectric film 119, in accordance with some embodiments. In some embodiments, the first via holes 119A are opened to expose parts of the top surface of the base layer 110. The first via holes 119A may be formed in the first dielectric film 119 by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Next, as shown in FIGS. 5A through 5C, a base electrode 118 is formed on the first dielectric film 119 and is electrically connected to the base layer 110 through the first via holes 119A disposed in the first dielectric film 119, in accordance with some embodiments. In the illustrated embodiment, two mesas 170 including the emitter layers 112 are disposed on one mesa 180. It should be noted that such quantity of the mesa or mesas 170 disposed on one mesa 180 is merely an example and such quantity of the mesa or mesas 170 in the present embodiment is not limited thereto. One mesa 170 or three or more mesas 170 can be disposed on one mesa 180 in different embodiments. In some embodiments, the mesa 170 or predetermined at least one of the mesas 170 including the emitter layer 112 is each disposed laterally between two of the first via holes 119A, and the predetermined mesa or mesas 170 and the first via holes 119A are laterally alternatively disposed. As shown in FIGS. 5A and 5B, the first dielectric film 119 is disposed or sandwiched between the base electrode 118 and a first sidewall 180S1 of the mesa 180, in accordance with some embodiments.

In some embodiments, the base electrode 118 is a comb-like electrode and will be subsequently described in more detailed. The processes and materials for forming the base electrode 118 may be the same as, or similar to, those used to form the emitter electrode 116. For the purpose of brevity, the descriptions of these processes and materials are not repeated herein.

Next, as shown in FIGS. 6A through 6C, a second dielectric film 120 is formed on the first dielectric film 119 and the base electrode 118, in accordance with some embodiments. In some embodiments, the second dielectric film 120 completely covers the base electrode 118 on the top surface of the base layer 110. The processes and materials for forming the second dielectric film 120 may be the same as, or similar to, those used to form the first dielectric film 119. For the purpose of brevity, the descriptions of these processes and materials are not repeated herein. Also, it should be noted that the second dielectric film 120 is also shown as a transparent film in FIG. 6A for the clarity to show the underlying layers. When the second dielectric film 120 is really shown, only the second dielectric film 120 and structures exposed by subsequently formed via holes can be seen in the top view in some embodiments.

Next, also referring to FIGS. 6A through 6C, at least one second via hole 121 is formed in the second dielectric film 120, in accordance with some embodiments. In some embodiments, the second via hole 121 is formed to expose parts of the top surface of the base electrode 118 beyond the mesa 180. In some embodiments, the second via hole 121 is laterally spaced away from the top surface of the base layer 110. In some embodiments, the second via hole 121 is located away from the top surface of the base layer 110 by a first distance D1 in the top view, such as FIGS. 6A and 7A. As shown in FIG. 6B, the second via hole 121 is defined by inner sidewalls 120a of the second dielectric film 120 and a top surface 118T of the base electrode 118.

Next, referring to FIGS. 6A through 6D, a or a plurality of third via hole or third via holes 123 is or are formed through the second dielectric film 120 and the first dielectric film 119, in accordance with some embodiments. In some embodiments, the third via hole or third via holes 123 is or are formed to expose parts of the top surface of the mesa 170. In some embodiments, the height H3 of the third via hole or third via holes 123 is or are greater than the height H1 (shown in FIG. 4B) of the first via hole 119A. In some embodiments, the height H3 of the third via hole or third via holes 123 is or are greater than the height H2 of the second via hole 121. In some embodiments, the height H2 of the second via hole 121 is substantially the same as the height H1 (shown in FIG. 4B) of the first via hole 119A.

Moreover, a fourth via hole 122 is formed and opened on a second sidewall 180S2 of the second mesa 180 through the second dielectric film 120 and the first dielectric film 119, in accordance with some embodiments. In some embodiments, the first sidewall 180S1 and the second sidewalls 180S2 of the second mesa 180 are at neighboring sides of the second mesa 180. In some embodiment, the fourth via hole 122 is further extended to the bottom sub-collector layer 104A beyond the second mesa 180 through the second dielectric film 120 and the first dielectric film 119. The processes for forming the second, third and fourth via holes 121, 123 and 122 may be the same as, or similar to, those used to form the first via holes 119A. For the purpose of brevity, the descriptions of these processes are not repeated herein.

In some embodiments, the second, third and fourth via holes 121, 123 and 122 are simultaneously formed in the same step. In some embodiments the second, third and fourth via holes 121, 123 and 122 are separately formed in different steps. In some embodiments, the second and third via holes 121 and 123 are simultaneously formed in the same step different from a step for the fourth via hole 122. In some embodiments, the second and fourth via holes 121 and 122 are simultaneously formed in the same step different from a step for the third via hole or third via holes 123. In some embodiments, the third and fourth via holes 123 and 122 are simultaneously formed in the same step different from a step for the second via hole 121.

Next, as shown in FIGS. 7A and 7B, in the heterojunction bipolar transistor 100, a conductive layer 125 is formed on the second dielectric film 120 and is electrically connected to the base electrode 118 through the second via hole 121 (shown in FIGS. 6A through 6C), in accordance with some embodiments. In some embodiments, the conductive layer 125 is also electrically connected to the mesa or mesas 170 including the emitter layer or emitter layers 112 through the third via hole or third via holes 123. The conductive layer 125 may include conductive material such as Ti, Al, Au, Pd, Pt, Cu, W, other suitable metal, an alloy thereof, a multi-layer thereof or a combination thereof. The processes for forming the conductive layer 125 may be the same as, or similar to, those used to form the emitter electrode 116. For the purpose of brevity, the descriptions of these processes are not repeated herein.

As shown in FIGS. 7A and 7C, a collector electrode 124 is formed in the fourth via hole 122 and is electrically connected to the upper sub-collector layer 104B through the fourth via hole 122, in accordance with some embodiments. The collector electrode 124 may include conductive material such as Ti, Al, Au, Pd, Pt, Cu, W, other suitable metal, its alloy, or a combination thereof. The processes for forming the collector electrode 124 may be the same as, or similar to, those used to form the emitter electrode 116. For the purpose of brevity, the descriptions of these processes are not repeated herein. In some embodiments, the conductive layer 125 and the collector electrode 124 are simultaneously formed.

In some embodiments, an additional fourth via hole 122 is formed and opened on a third sidewall 180S3 of the second mesa 180 through the second dielectric film 120 and the first dielectric film 119. The first sidewall 180S1 and the third sidewall 180S3 of the second mesa 180 are at neighboring sides of the second mesa 180, in accordance with some embodiments. In some embodiments, the second sidewall 180S2 and the third sidewall 180S3 of the second mesa 180 are at opposite sides of the second mesa 180. In some embodiments, the additional fourth via hole 122 is further extended to the bottom sub-collector layer 104A beyond the second mesa 180 through the second dielectric film 120 and the first dielectric film 119. An additional collector electrode 124 is formed in the additional fourth via hole 122 on a third sidewall 180S3 of the second mesa 180 and is electrically connected to the upper sub-collector layer 104B through the fourth via hole 122, in accordance with some embodiments.

As described above, the upper sub-collector layer 104B and the bottom sub-collector layer 104A may be highly doped with a doping concentration of in a range of between 1e18 cm$^{-3}$ to 1e20 cm$^{-3}$. Therefore, an ohmic contact may be formed between the collector electrodes 124 and the upper sub-collector layer 104B. In addition, an ohmic contact may also be formed between the collector electrodes 124 and the bottom sub-collector layer 104A. With such a large ohmic contact area, the collector resistance may be reduced.

As shown in FIGS. 7B and 7C, an angle θ1 between the first sidewall 180S1 of the mesa 180 and a bottom surface of the upper sub-collector layer 104B or the etch stop layer 106A if formed, an angle θ2 between the second sidewall 180S2 of the mesa 180 and the bottom surface of the upper sub-collector layer 104B or the etch stop layer 106A if formed, an angle θ3 between the third sidewall 180S3 of the mesa 180 and the bottom surface of the upper sub-collector layer 104B or the etch stop layer 106A if formed may respectively be less than 90 degrees. In some embodiments, the angles θ1, θ2 and θ3 may respectively be in a range of 20 degrees to 89 degrees. In some embodiments, the angles θ1, θ2 and θ3 may respectively be in a range of 30 degrees to 80 degrees. In some embodiments, the angles θ1, θ2 and θ3 may respectively be in a range of 30 degrees to 70 degrees. In some embodiments, the angles θ1, θ2 and θ3 may respectively be in a range of 20 degrees to 80 degrees. If the angles θ2 and θ3 are too small, the collector electrodes 124 may be far away from the base and the collector resistance may increase. If the angles θ1, θ2 and θ3 are too large, it may be not easy to form the collector electrodes 124 and the base electrode 118 on the corresponding sidewalls.

In some embodiments as shown in FIG. 7C, a thickness of the collector electrode 124 on the second or third sidewall 180S2 or 180S3 of the mesa 180 and a thickness of the collector electrode 124 on the top surface 104T of the bottom sub-collector layer 104A are substantially the same. It should be noted that although the shape of the collector electrode 124 is conformal on the second or third sidewall 180S2 or 180S3 of the mesa 180 and the top surface 104T of the bottom sub-collector layer 104A, the shape of the collector electrodes 124 are not limited thereto. The collector electrodes 124 may be in any shape, depending on the demands of the collector resistance.

In some embodiments as shown in FIG. 7A, the ratio of the area of the second via hole 121 to the area of the emitter layer 112 or the mesa 170 in a top view is between 0.001 and 0.2 for a better distribution of the input current density and output current density of the heterojunction bipolar transistor 100. In some embodiments as shown in FIG. 7A, the second via hole 121 is located away from the bottom surface of the second mesa 180 by a second distance D2, and the ratio of the second distance D2 to the first distance D1 is between 0.95 and 0.54 to better control the angle θ1.

Figure 10A:
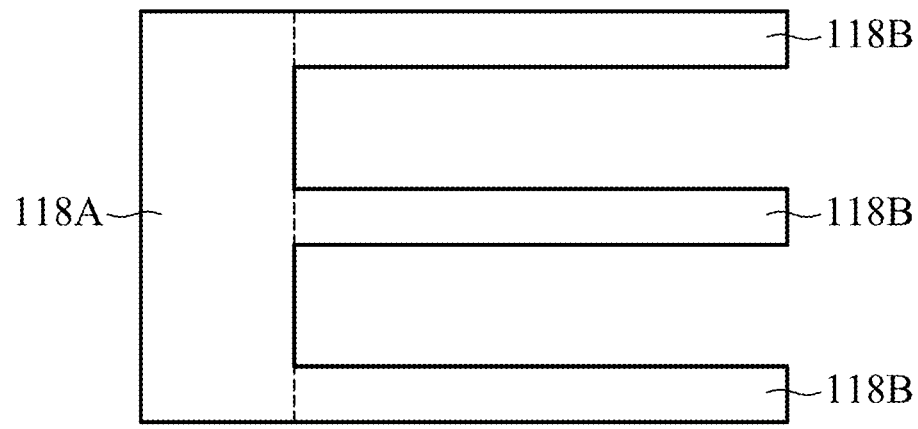
FIGS. 10A and 10B show top views schematically illustrating exemplary base electrodes of heterojunction bipolar transistors in accordance with some embodiments.

In some embodiments, as shown in FIG. 7A, the base electrode 118 is comb-like. The top view of the comb-like base electrode 118 is separately shown in FIG. 10A. With reference to FIGS. 7A and 10A, the comb-like base electrode 118 includes a body 118A and a plurality of teeth 118B, in accordance with some embodiments. In some embodiments, the body 118A is connected to the conductive layer 125 through the second via hole 121 and extends to be above the top surface of the base layer 110, and the teeth 118B are branched from the body 118A above the top surface of the base layer 110 and respectively extend to fill the first via holes 119A. In this embodiment, the body 118A is at least partially exposed by the second via hole 121 in a forming stage equivalent to the stage shown in FIG. 6B. In some embodiments, the mesa 170 or predetermined at least one of the mesas 170 including the emitter layer 112 is each disposed laterally between two of the teeth 118B, and the predetermined mesa or mesas 170 and the teeth 118B are laterally alternatively disposed.

Figure 8:
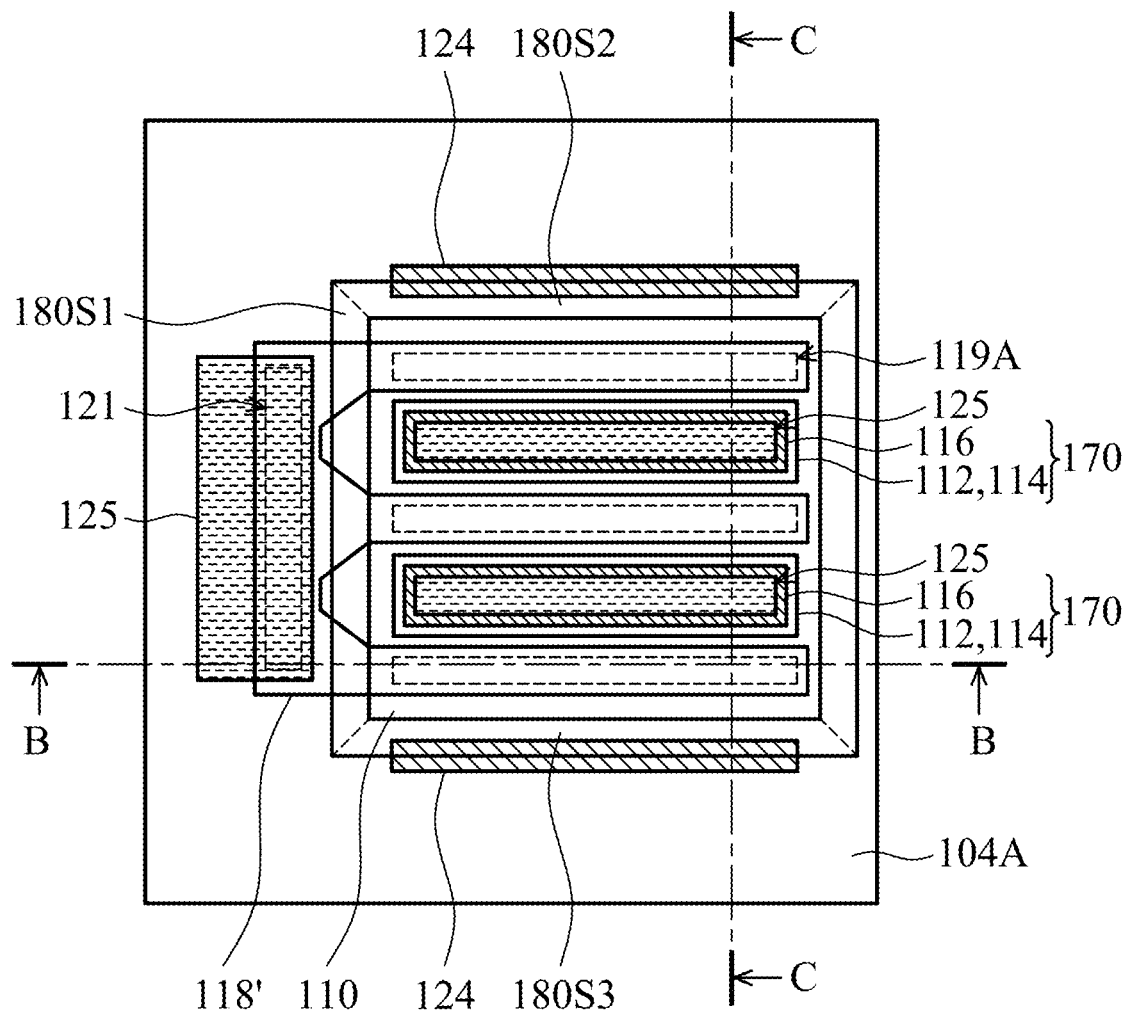
FIG. 8 shows a top view schematically illustrating a heterojunction bipolar transistor in accordance with some embodiments.
Figure 10B:
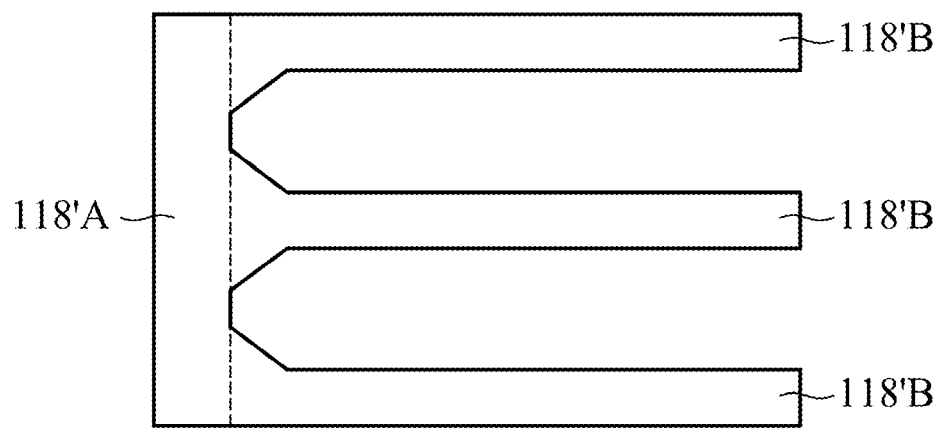

Many variations and/or modifications may be made to the embodiments of the disclosure. Some processes or devices are the same as, or similar to, those described in the embodiments above, and therefore the descriptions of these processes and devices are not repeated herein. FIG. 8 is a top view of a heterojunction bipolar transistor in accordance with some other embodiments. The cross-sectional views taken along lines BB and CC in FIG. 8 are equivalent to those shown in FIGS. 7B and 7C. The heterojunction bipolar transistor is similar to the heterojunction bipolar transistor 100 shown in FIG. 7A, but a base electrode 118' replaces the base electrode 118 of the heterojunction bipolar transistor 100. In some embodiments, as shown in FIG. 8, the base electrode 118' is also comb-like. The top view of the comb-like base electrode 118' is separately shown in FIG. 10B. With reference to FIGS. 8 and 10B, the comb-like base electrode 118' includes a body 118A' and a plurality of teeth 118B', in accordance with some embodiments. In some embodiments, the body 118A' is connected to the conductive layer through the second via 121. In this embodiment, the body 118A' is at least partially exposed by the second via 121 in a forming stage equivalent to the stage shown in FIG. 6B. In some embodiments, the body 118A' is beyond the stack of the mesa 180, and the teeth 118B' are branched from the body 118A' beyond the mesa 180 and respectively extend to be above the top surface of the base layer 110 to fill the first via holes 119A. In some embodiments, the boundaries between the body 118A' and the respective teeth 118B' locate beyond the stack of the mesa 180. In some embodiments, the width of every tooth 118B' is greater at the boundary with the body 118A', but decreases gradually to a predetermined value and substantially keeps constant along the extension to fill the first via holes 119A. In some embodiments, the mesa 170 or predetermined at least one of the mesas 170 including the emitter layer 112 is each disposed laterally between two of the teeth 118B', and the predetermined mesa or mesas 170 and the teeth 118B' are laterally alternatively disposed.

Figure 9A:
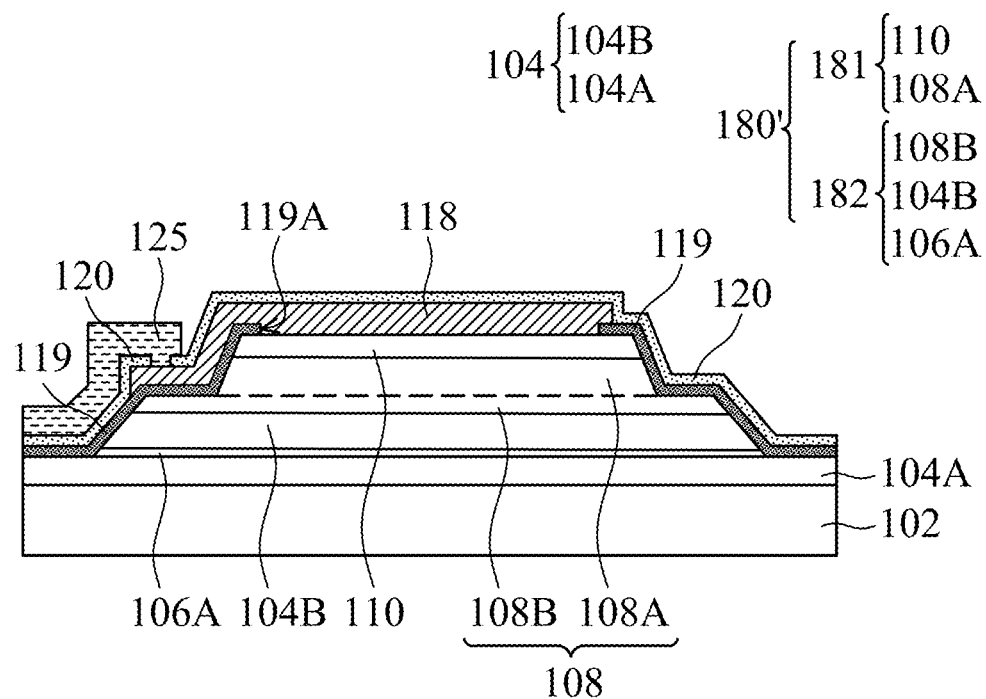
FIGS. 9A and 9B show cross-sectional views schematically illustrating a heterojunction bipolar transistor in accordance with some embodiments.
Figure 9B:
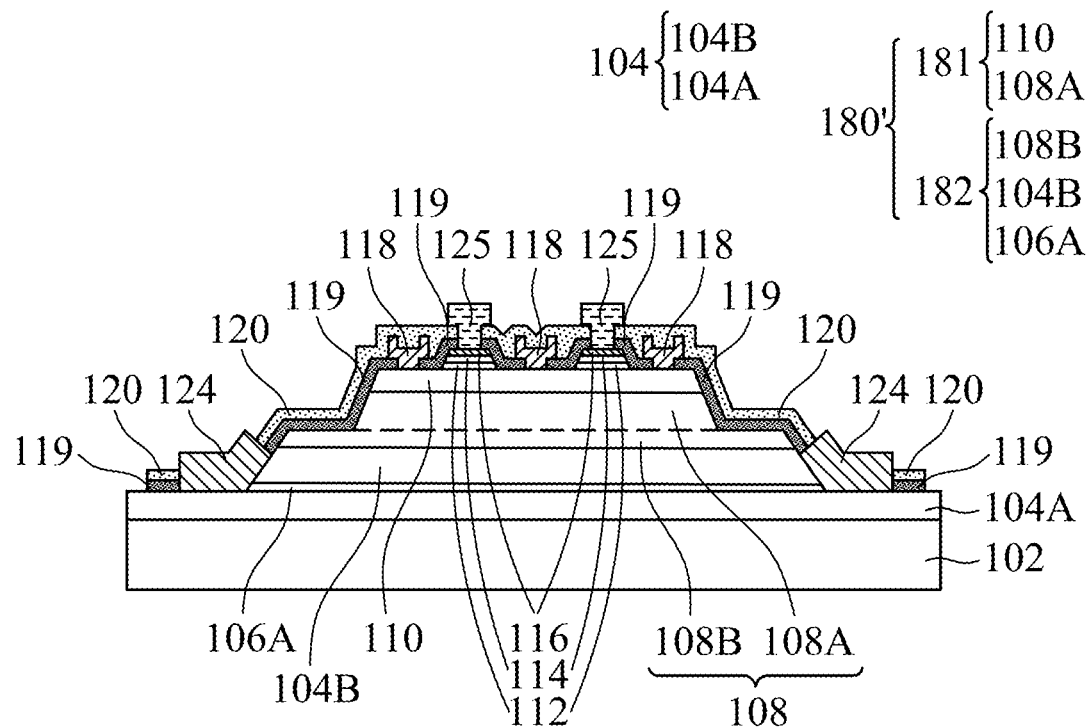

Many variations and/or modifications may be made to the embodiments of the disclosure. FIGS. 9A and 9B are cross-sectional views representation of a heterojunction bipolar transistor in accordance with some other embodiments with a top view similar to that shown in FIG. 7A or 8. In some embodiments, FIG. 9A is taken along a line of the top view corresponding to the line B-B of FIG. 7A or 8, and FIG. 9B is taken along a line of the top view corresponding to the line C-C of FIG. 7A or 8. Some processes or devices are the same as, or similar to, those described in the embodiments above, and therefore the descriptions of these processes and devices are not repeated herein. The difference from the aforementioned embodiments with cross-sectional views shown in FIGS. 7B and 7C is that, as shown in FIGS. 9A and 9B in accordance with some other embodiments, the mesa 180' under the mesa 170 is a two-stage mesa, and a combined mesa by a mesa 181 over a mesa 182. The mesa 182 is disposed between the mesa 181 and the bottom sub-collector layer 104A. In some embodiments, the two-stage mesa is formed by multiple lithography processes and etching processes.

As shown in FIGS. 9A and 9B, the collector layer 108 includes a lower sub-layer 108B and an upper sub-layer 108A disposed on the lower sub-layer 108B, in accordance with some embodiments. In some embodiments, the upper sub-layer 108A incompletely covers the lower sub-layer 108B and included in the mesa 181. Specifically, the mesa 181 includes the upper sub-layer 108A of the collector layer 108 and the base layer 110 disposed on the upper sub-layer 108A in these embodiments. The mesa 182 includes the lower sub-layer 108B of the collector layer 108 and the upper sub-collector layer 104B disposed between the bottom sub-collector layer 104A and the lower sub-layer 108B of the collector layer 108, in accordance with some embodiments.

As shown in FIGS. 9A and 9B, the base electrode 118 includes a shoulder part disposed on parts of the first dielectric film 119 on the lower sub-layer 108B of the collector layer 108 not covered by the upper sub-layer 108A of the collector layer 108 and a plurality of extending parts respectively extending from the shoulder part into the first via holes 119A. In some embodiments, the shoulder part of the base electrode 118 shown in FIG. 9A is equivalent or similar to the body 118A of the base electrode 118 shown in 10A and the extending parts of the base electrode 118 shown in FIG. 9A is equivalent or similar to the teeth 118B of the base electrode 118 shown in FIG. 10A.

In the embodiments shown in FIGS. 9A and 9B, the heterojunction bipolar transistor includes the collector layer 108 having the upper sub-layer 108A with reduced footprint. Therefore, the base-collector contact area may be further reduced. Therefore, the base-collector parasitic capacitance of the heterojunction bipolar transistor can be further reduced.

Figure 9C:
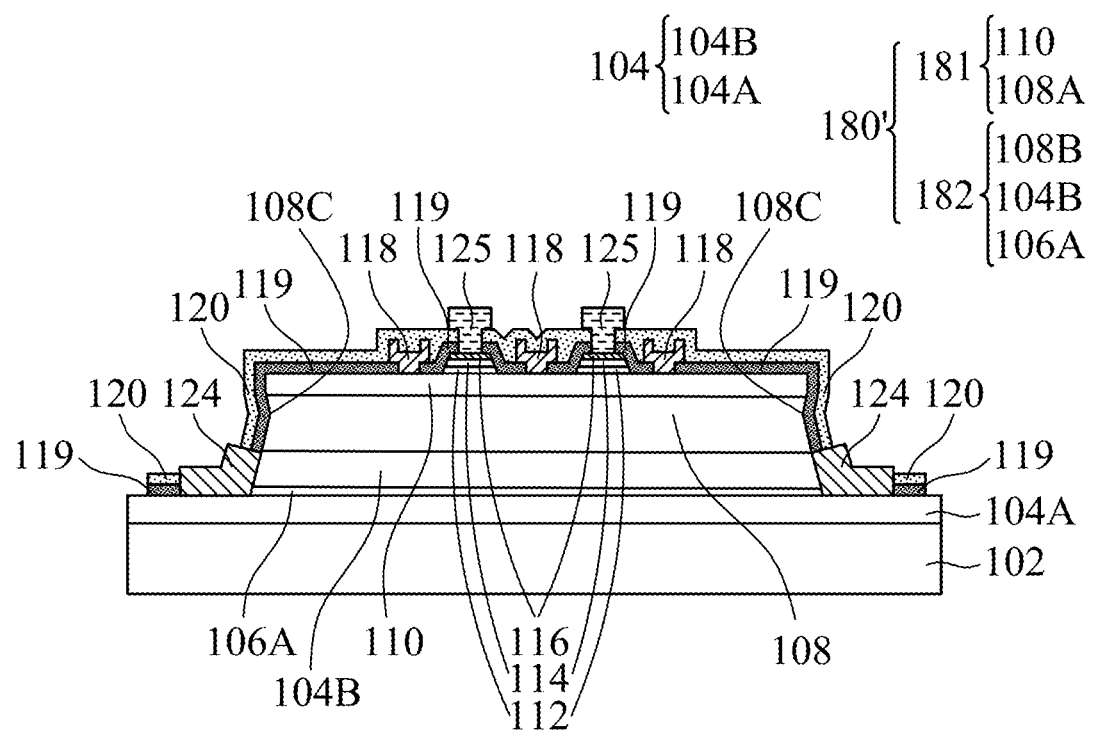
FIG. 9C shows a cross-sectional view schematically illustrating a heterojunction bipolar transistor in accordance with some embodiments.

Many variations and/or modifications may be made to the embodiments of the disclosure. A heterojunction bipolar transistor in accordance with some other embodiments may have a top view similar to that shown in FIG. 7A or 8, a cross-sectional view taken along a line of the top view corresponding to the line B-B of FIG. 7A or 8 which is the same as that shown in FIG. 9A, and a cross-sectional view taken along a line of the top view corresponding to the line C-C of FIG. 7A or 8 which is shown in FIG. 9C. Some processes or devices are the same as, or similar to, those described in the embodiments above, and therefore the descriptions of these processes and devices are not repeated herein. The difference from the embodiments described in FIGS. 9A and 9B is that, as shown in FIG. 9C in accordance with some other embodiments, the collector layer 108 is etched laterally and includes undercut profiles at sidewalls thereof.

In some embodiments, as shown in FIG. 9C, the collector layer 108 includes a neck 108C between the top surface and the bottom surface thereof. In some embodiments, as shown in FIG. 9C, the width of the collector layer 108 gradually decreases from the bottom surface to the neck 108C thereof, and gradually increases from the neck 108C to the top surface thereof.

In some embodiments, as shown in FIG. 9C, the upper sub-collector layer 104B and the etch stop layer 106A, if formed, has a gradually decreased width from an interface with the bottom sub-collector layer 104A to an interface with the collector layer 108.

In some embodiments, as shown in FIGS. 9A and 9C, a stack of the upper sub-collector layer 104B, the collector layer 108, and the base layer 110 includes a two-stage profile (e.g., the sub-layer 108A incompletely covers the sub-layer 108B) along a first direction, and includes an undercut profile (e.g., the neck 108C of the collector layer 108) along a second direction substantially perpendicular to the first direction. In some embodiments, the manufacturing flexibility can be increased since the heterojunction bipolar transistor includes the two-stage profile along the first direction and the undercut profile along the second direction.

As mentioned above, in the present disclosure, a heterojunction bipolar transistor and a method of forming the same is provided. With the decreased base-collector contact area, the base-collector parasitic capacitance of the heterojunction bipolar transistor can be further reduced. Therefore, the maximum stable gain of the heterojunction bipolar transistor can be improved.

In one example aspect, the present disclosure provides a heterojunction bipolar transistor including a bottom sub-collector layer, an upper sub-collector layer, a collector layer, a base layer, an emitter layer, a first dielectric film, a base electrode, a second dielectric film and a conductive layer. The upper sub-collector layer is disposed over the bottom sub-collector layer. The collector layer is disposed on the upper sub-collector layer. The base layer is disposed on the collector layer. The emitter layer is disposed on the base layer. The first dielectric film is disposed over the bottom sub-collector layer and extends until it is over the base layer and the emitter layer. The base electrode is disposed on the first dielectric film and is electrically connected to the base layer through at least one first via hole disposed in the first dielectric film. The first dielectric film is disposed between the base electrode and a first sidewall of a stack including the base layer and the collector layer. The second dielectric film is disposed on the first dielectric film and the base electrode. The conductive layer is disposed on the second dielectric film and electrically connected to the base electrode through a second via hole disposed in the second dielectric film. The second via hole is laterally spaced away from the base layer.

Another one aspect of the present disclosure pertains to a heterojunction bipolar transistor including a first mesa, a second mesa, a first sub-collector layer, a first dielectric film, a base electrode, a second dielectric film and a conductive layer. The first mesa is disposed on the second mesa. The second mesa is disposed over a first sub-collector layer. The second mesa includes at least a part of a collector layer and a base layer disposed on the part of the collector layer. The first mesa includes an emitter layer disposed on the base layer. The first dielectric film is disposed over the first sub-collector layer. The first dielectric film covers the second mesa and the first mesa. The base electrode is disposed on the first dielectric film and is electrically connected to the base layer through at least one first via hole disposed in the first dielectric film. The first dielectric film is sandwiched between the base electrode and a first sidewall of the second mesa. The second dielectric film is disposed on the first dielectric film and the base electrode. The conductive layer is disposed on the second dielectric film and is electrically connected to the base electrode through a second via hole disposed in the second dielectric film. The second via hole is laterally spaced apart from the base layer and exposes parts of the base electrode.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heterojunction bipolar transistor, comprising:
   a first sub-collector layer;
   a collector layer disposed over the first sub-collector layer;
   a base layer disposed on the collector layer;
   an emitter layer disposed on the base layer;
   a first dielectric film disposed over the first sub-collector layer, and extending over the base layer and the emitter layer;
   a base electrode disposed on the first dielectric film, electrically connected to the base layer through at least one first via hole disposed in the first dielectric film, and comprising a lower portion disposed in the at least one first via hole and an upper portion disposed on the first dielectric film and covering the lower portion, wherein the first dielectric film is disposed between the base electrode and a first sidewall of a stack comprising the base layer and the collector layer, and the upper portion is wider or longer than the lower portion;
   a second dielectric film disposed on the first dielectric film and the base electrode; and
   a conductive layer disposed on the second dielectric film and electrically connected to the emitter layer through a third via hole through the second dielectric film and the first dielectric film, wherein a height of the third via hole is greater than a height of the at least one first via hole.

2. The heterojunction bipolar transistor as claimed in claim 1, wherein the second dielectric film completely covers the base electrode on a top surface of the base layer.

3. The heterojunction bipolar transistor as claimed in claim 1, wherein the conductive layer is further electrically connected to the base electrode through a second via hole disposed in the second dielectric film.

4. The heterojunction bipolar transistor as claimed in claim 3, wherein a ratio of an area of the second via hole to an area of the emitter layer in a top view is between 0.001 and 0.2.

5. The heterojunction bipolar transistor as claimed in claim 3, wherein the second via hole is laterally spaced away from the base layer.

6. The heterojunction bipolar transistor as claimed in claim 3, wherein a height of the third via hole is greater than a height of the second via hole.

7. The heterojunction bipolar transistor as claimed in claim 1, further comprising a collector electrode in direct contact with the first sub-collector layer.

8. The heterojunction bipolar transistor as claimed in claim 3, wherein a plurality of first via holes are disposed in the first dielectric film, and the base electrode is comb-like and comprises:
   a body connected to the conductive layer through the second via hole and extending above a top surface of the base layer; and
   a plurality of teeth branched from the body above the top surface of the base layer and respectively extending to fill the first via holes.

9. The heterojunction bipolar transistor as claimed in claim 3, wherein a plurality of first via holes are disposed in the first dielectric film, and the base electrode is comb-like and comprises:
   a body connected to the conductive layer through the second via hole and beyond the stack; and
   a plurality of teeth branched from the body and respectively extending above a top surface of the base layer to fill the first via holes.

10. A heterojunction bipolar transistor, comprising:
a first mesa disposed on a second mesa disposed over a first sub-collector layer, wherein the second mesa comprises at least a part of a collector layer and a base layer disposed on the part of the collector layer, and the first mesa comprises an emitter layer disposed on the base layer;
a first dielectric film disposed over the first sub-collector layer, covering the second mesa and the first mesa;
a base electrode disposed on the first dielectric film and electrically connected to the base layer through at least one first via hole disposed in the first dielectric film, wherein the first dielectric film is sandwiched between the base electrode and a first sidewall of the second mesa, and parts of the base electrode disposed on the first dielectric film and parts of the base electrode disposed in the at least one first via hole have a T-shaped profile in a first cross-sectional view;
a second dielectric film disposed on the first dielectric film and the base electrode; and
a conductive layer disposed on the second dielectric film and electrically connected to the first mesa through a third via hole through the second dielectric film and the first dielectric film, wherein a height of the third via hole is greater than a height of the at least one first via hole.

11. The heterojunction bipolar transistor as claimed in claim 10, wherein the conductive layer is further electrically connected to the base electrode through a second via hole disposed in the second dielectric film, and the second via hole exposes parts of the base electrode beyond the second mesa.

12. The heterojunction bipolar transistor as claimed in claim 10, further comprising a collector electrode in direct contact with the first dielectric film and the second dielectric film.

13. The heterojunction bipolar transistor as claimed in claim 10, further comprising a third mesa disposed between the second mesa and the first sub-collector layer, wherein
the collector layer comprises a lower sub-layer and an upper sub-layer disposed on the lower sub-layer, wherein the upper sub-layer incompletely covers the lower sub-layer and acts as part of the collector layer that is included in the second mesa; and
the third mesa comprises the lower sub-layer of the collector layer and a second sub-collector layer disposed between the first sub-collector layer and the lower sub-layer of the collector layer.

14. The heterojunction bipolar transistor as claimed in claim 13, wherein
the base electrode comprises a shoulder part disposed on parts of the first dielectric film on the lower sub-layer of the collector layer not covered by the upper sub-layer of the collector layer and a plurality of extending parts respectively extending from the shoulder part into the first via holes; and
the conductive layer is further electrically connected to the base electrode through a second via hole disposed in the second dielectric film, and the second via hole is opened on the shoulder part of the base electrode.

15. The heterojunction bipolar transistor as claimed in claim 13, wherein
the upper sub-layer incompletely covers the lower sub-layer in a second cross-sectional view along a first direction of a top view; and
the collector layer comprises a neck in a third cross-sectional view along a second direction substantially perpendicular to the first direction of the top view.

16. The heterojunction bipolar transistor as claimed in claim 10, further comprising:
a second sub-collector layer disposed between the first sub-collector layer and the collector layer.

17. The heterojunction bipolar transistor as claimed in claim 16, further comprising:
an etch stop layer disposed between the first sub-collector layer and the second sub-collector layer.

18. The heterojunction bipolar transistor as claimed in claim 16, further comprising a collector electrode electrically connected to the second sub-collector layer through a fourth via hole opened on a second sidewall of the second sub-collector layer through the second dielectric film and the first dielectric film.

19. The heterojunction bipolar transistor as claimed in claim 18, wherein the fourth via hole is further extended to the first sub-collector layer beyond second sub-collector layer through the second dielectric film and the first dielectric film, and the collector electrode is further electrically connected to the first sub-collector layer through the fourth via hole.

20. The heterojunction bipolar transistor as claimed in claim 10, wherein the conductive layer is further electrically connected to the base electrode through a second via hole disposed in the second dielectric film, and the second via hole is laterally spaced apart from the base layer and exposes parts of the base electrode.

* * * * *